(12) United States Patent
Yoshida

(10) Patent No.: US 8,698,709 B2
(45) Date of Patent: **\*Apr. 15, 2014**

(54) DISPLAY DEVICE AND DRIVING METHOD THEREOF

(75) Inventor: Yasunori Yoshida, Kanagawa (JP)

(73) Assignee: Semiconductor Energy Laboratory Co., Ltd., Atsugi-shi, Kanagawa-ken (JP)

( \* ) Notice: Subject to any disclaimer, the term of this patent is extended or adjusted under 35 U.S.C. 154(b) by 356 days.

This patent is subject to a terminal disclaimer.

(21) Appl. No.: 13/167,776

(22) Filed: Jun. 24, 2011

(65) Prior Publication Data

US 2011/0248981 A1 Oct. 13, 2011

Related U.S. Application Data

(63) Continuation of application No. 11/530,771, filed on Sep. 11, 2006, now Pat. No. 7,969,390.

(30) Foreign Application Priority Data

Sep. 15, 2005 (JP) ................................. 2005-269013

(51) Int. Cl.
*G09G 3/30* (2006.01)
(52) U.S. Cl.
USPC .......................................................... 345/76
(58) Field of Classification Search
USPC ..................... 345/76–83, 204, 690; 315/169.3
See application file for complete search history.

(56) References Cited

U.S. PATENT DOCUMENTS

| | | | |
|---|---|---|---|
| 5,714,968 | A | 2/1998 | Ikeda |
| 6,229,506 | B1 | 5/2001 | Dawson et al. |
| 6,348,906 | B1 | 2/2002 | Dawson et al. |
| 6,535,185 | B2 | 3/2003 | Kim et al. |
| 6,542,142 | B2 | 4/2003 | Yumoto et al. |
| 6,577,302 | B2 | 6/2003 | Hunter et al. |
| 6,753,655 | B2 | 6/2004 | Shih et al. |
| 6,919,871 | B2 | 7/2005 | Kwon |
| 6,930,680 | B2 | 8/2005 | Miyazawa |
| 7,098,905 | B2 | 8/2006 | Abe et al. |
| 7,138,968 | B2 | 11/2006 | Kasai et al. |

(Continued)

FOREIGN PATENT DOCUMENTS

| | | | |
|---|---|---|---|
| EP | 1220191 | A2 | 7/2002 |
| EP | 1321922 | A2 | 6/2003 |

(Continued)

OTHER PUBLICATIONS

International Search Report (Application No. PCT/JP2006/318097), dated Dec. 19, 2006.

(Continued)

*Primary Examiner* — Stephen Sherman
(74) *Attorney, Agent, or Firm* — Fish & Richardson P.C.

(57) ABSTRACT

To solve the lack of program time, which is a problem of a display device including an EL element, and to provide a display device including a pixel circuit with a high aperture ratio and a driving method thereof. In a circuit including a driving transistor, a capacitor, a display element which can be used as a capacitor, a first power supply line and a second power supply line, potentials of the first power supply line and the second power supply line are set to be almost the same, thereby a threshold voltage of the driving transistor is held in the display element, and after that, a charge is divided into the display element and the capacitor.

22 Claims, 18 Drawing Sheets

(56) References Cited

U.S. PATENT DOCUMENTS

| | | |
|---|---|---|
| 7,193,589 B2 | 3/2007 | Yoshida et al. |
| 7,324,075 B2 | 1/2008 | Sano et al. |
| 7,518,580 B2 | 4/2009 | Kwon |
| 7,551,151 B2 | 6/2009 | Kasai et al. |
| 7,573,441 B2 | 8/2009 | Kwon |
| 7,969,389 B2 | 6/2011 | Miyazawa |
| 8,217,863 B2 | 7/2012 | Kwon |
| 8,289,240 B2 | 10/2012 | Kwon |
| 2001/0026251 A1 | 10/2001 | Hunter et al. |
| 2003/0132931 A1 | 7/2003 | Kimura et al. |
| 2004/0004443 A1 | 1/2004 | Park et al. |
| 2004/0090186 A1 | 5/2004 | Yoshida et al. |
| 2004/0150595 A1 | 8/2004 | Kasai |
| 2004/0174349 A1 | 9/2004 | Libsch et al. |
| 2004/0174354 A1 | 9/2004 | Ono et al. |
| 2004/0196239 A1 | 10/2004 | Kwon |
| 2005/0068274 A1 | 3/2005 | Lo |
| 2005/0099368 A1 | 5/2005 | Abe et al. |
| 2005/0151705 A1 | 7/2005 | Fish |
| 2005/0185108 A1 | 8/2005 | Chen |
| 2005/0190177 A1 | 9/2005 | Yumoto |
| 2005/0200300 A1 | 9/2005 | Yumoto |
| 2005/0206593 A1 | 9/2005 | Kwon |
| 2005/0265071 A1 | 12/2005 | Kwon |
| 2009/0267935 A1 | 10/2009 | Kwon |

FOREIGN PATENT DOCUMENTS

| | | |
|---|---|---|
| EP | 1418566 A2 | 5/2004 |
| EP | 1465143 A2 | 10/2004 |
| EP | 1777692 A2 | 4/2007 |
| EP | 1921596 A2 | 5/2008 |
| JP | 2003-177709 A | 6/2003 |
| JP | 2004-078210 A | 3/2004 |
| JP | 2004-280059 A | 10/2004 |
| JP | 2004-295131 A | 10/2004 |
| JP | 2004-310006 A | 11/2004 |
| JP | 2005-181920 A | 7/2005 |
| KR | 2004-0085653 A | 10/2004 |
| TW | 507179 B | 10/2002 |
| TW | 200426734 A | 12/2004 |
| TW | I239497 B | 9/2005 |
| WO | 01/75852 A1 | 10/2001 |

OTHER PUBLICATIONS

Written Opinion (Application No. PCT/JP2006/318097), dated Dec. 19, 2006.

Search Report (European Patent Application No. 06797889.0) dated Jul. 1, 2009.

S. Ono et al.; "Pixel Circuit for a-Si AM-OLED"; IDW '03 : Proceedings of the 10th International Display Workshops; Dec. 3, 2003; pp. 255-258.

Taiwanese Office Action (TW Patent Application No. 095134058) dated Jul. 15, 2013, with English translation, 16 pages.

PRIOR ART

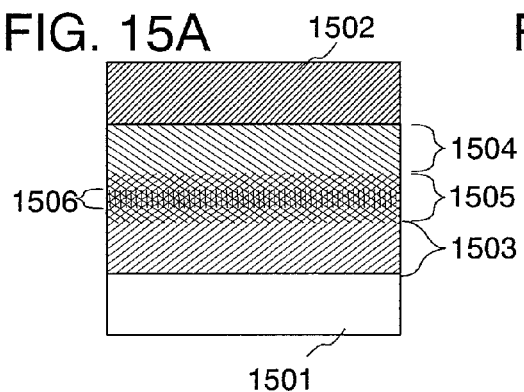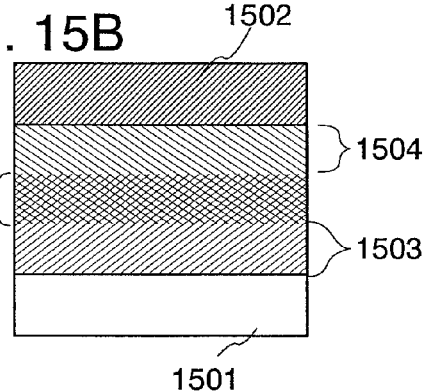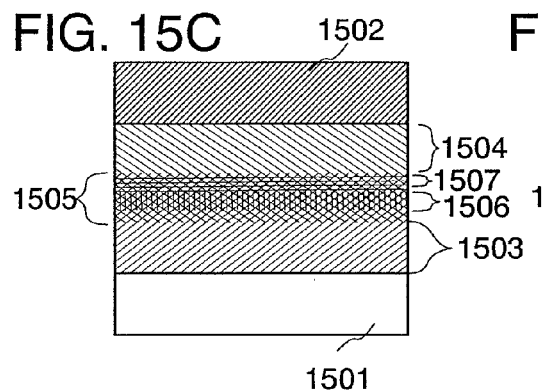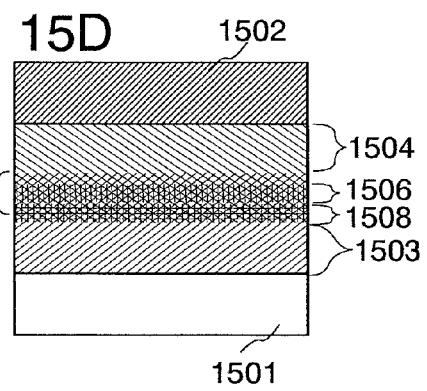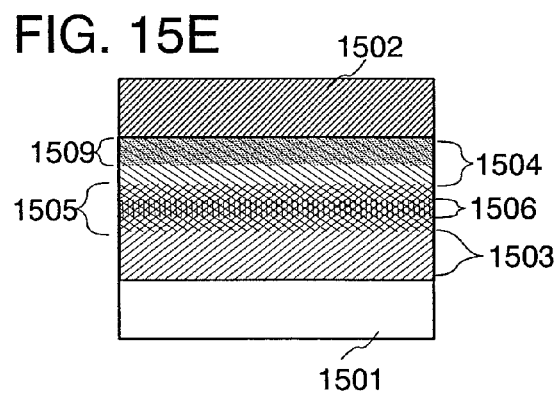

DISPLAY DEVICE AND DRIVING METHOD THEREOF

CROSS-REFERENCE TO RELATED APPLICATIONS

This application is a continuation of U.S. application Ser. No. 11/530,771, filed Sep. 11, 2006, now allowed, which claims the benefit of a foreign priority application filed in Japan as Serial No. 2005-269013 on Sep. 15, 2005, both of which are incorporated by reference.

TECHNICAL FIELD

The present invention relates to a display device to which a self-light emitting type display element is applied and a driving method thereof.

BACKGROUND ART

In a driving method of a display device, there are an active matrix drive and a passive matrix drive mainly. A passive matrix drive has a structure that a display element is sandwiched between electrodes arranged in matrix, which can be manufactured at low cost. However, when one pixel is driven, other pixels cannot be driven so that it is not good for a large-area or high-definition display device. On the other hand, an active matrix drive has an active element and a unit for holding luminance data in each pixel, so that manufacturing cost is higher than a passive matrix drive. However, while one pixel is driven, other pixels can emit light holding luminance data. Therefore, an active matrix driving method is used for most of large-area or high-definition display devices.

An active matrix display device has a unit for holding luminance data in each pixel as described above. The display device can be classified by whether the luminance data has a digital value or an analog value. When the luminance data has a digital value, a light emitting element has only a binary value of on or off, thereby a display image has only two gray scales. A method of expressing multi gray scale by displaying images of binary values quickly and repeatedly is widely used (time gray scale method). In addition, when the luminance data has an analog value, luminance of a display element can be controlled with an, intermediate value; therefore, a time gray scale method is not always required in order to express a multi gray scale.

An active matrix drive display device with luminance data having an analog value is mainly, for example, a liquid crystal display. A liquid crystal display has been spread widely, but has problems such as unfitness for displaying a moving image because of slow response speed, and dependence on viewing angle. In addition, a display element is not self-light emitting type; therefore, a back light is required so that power consumption is high. Therefore, development of a new display device replacing a liquid crystal display is expected.

On the other hand, a display device of so-called self-light emitting type, of which a pixel is formed of a light emitting element such as a light emitting diode (LED) attracts attention. As a light emitting element employed for a self-light emitting type display device, an organic light emitting diode (also called OLED (Organic Light Emitting Diode), organic EL element, electroluminescence (EL) element, and the like) attracts attention and is becoming to be used for an EL display and the like. Because a light emitting element such as an OLED is self-light emitting type, a pixel has higher visibility, a back light is not required, and response speed is faster as compared to a liquid crystal display. Therefore, an active matrix drive display device which employs the organic EL element as a display element has been developed actively.

Here, a description is made of an organic EL element. Luminance of an organic EL element is determined by a flowing current value. This nature mainly causes a problem of an organic EL element driven by an active matrix drive. In other words, when a voltage of an analog value is written to a luminance data holding unit (e.g., a capacitor) of a pixel like a liquid crystal display, an active element controlling a current flowing to a display element is controlled in an analog manner, unlike a liquid crystal display in which a voltage applied to a display element is controlled in an analog manner. The active element is provided in each EL element; therefore, a variation in electrical characteristics of an active element in each pixel directly causes a variation in luminance.

Accordingly, when a current drive type display element such as an organic EL element is driven by an active matrix drive by an analog value, it is important to compensate a characteristic variation of an active element which drives a display element. For the method thereof for example, a current input type display element is employed in which a structure of a pixel circuit is devised.

In a current input type pixel circuit, an analog current is employed as luminance data inputted to a pixel. Note that an analog current here refers a current outputted from a circuit which can control a current value by multi-level. An analog current (also referred to as a data current) made by such a peripheral driver circuit corresponding to luminance of a display element is supplied to an active element of each pixel, and a voltage applied to the active element at that time is held. As a result, the current value is held and may keep to be supplied to a display element even after a supply of data current is stopped. FIG. 8 shows an example of such a pixel circuit. A circuit shown in FIG. 8 includes a first power supply line ANODE, a second power supply line CATHODE, a current source for supplying a data current Idata, a wire DATA which the data current Idata flows, a display element 10, a driving transistor Tr1, a capacitor Cs as a luminance data holding unit, a switch Tr2 for connecting and disconnecting between a gate electrode and a drain electrode of the driving transistor Tr1, a switch Tr3 for selecting a pixel in which the Idata is supplied to the driving transistor Tr1, and a switch Tr4 for connecting and disconnecting between the display element 10 and the drain electrode of the driving transistor Tr1.

The current input type pixel circuit can keep supplying a data current as it is regardless of a characteristic of an active element, thereby being suitable for driving a current drive type display element by an active matrix drive. However, when a current value of a display element is very small when driven display element such as an organic EL element, there is a problem in that time (also referred to as program time) for charging the capacitor Cs becomes very long since a data current corresponds one-to-one to a current value of the display element 10 when driven in the circuit shown in FIG. 8.

Therefore, a current input type pixel circuit is suggested in which a data current can be increased against a current value when a display element is driven by adding a capacitor in a pixel circuit (refer to Patent Document 1).

[Patent Document 1]
Japanese Patent Laid-Open No. 2004-310006

DISCLOSURE OF INVENTION

As an example of a conventional pixel circuit, a pixel circuit corresponding to FIG. 5 of Patent Document 1 is shown in FIG. 9 (Note that reference numerals are changed from those in Patent Document 1). A circuit structure of FIG.

9 corresponds to a pixel circuit where a capacitor Ct for holding a threshold value and a switch Tr6 for connecting a capacitor, which are connected in series, are added to the pixel circuit in FIG. 8.

In Patent Document 1, a threshold voltage of a driving transistor Tr1 is held in a capacitor Ct for holding a threshold value before a data current corresponding voltage (also referred to as Vgs (data)) is held in a capacitor Cs for holding a threshold value, and Ct and Cs are connected after holding Vgs (data) in Cs, thereby a data current may be larger than a current value when a display element is driven. In addition, the difference thereof becomes larger as a capacitance value of Ct in response to a capacitance value of Cs is larger. A program time may be shortened by increasing a data current. Note that, a relationship of a current value (holed) when a display element is driven and a data current (Idata) is shown in equation 1.

$$Ioled = \left(\frac{Cs}{(Ct+Cs)}\right)^2 \times Idata \qquad \text{[Formula 1]}$$

Time to write a data current to one pixel is a value obtained by dividing one flame period (about one-60th second) by the number of scan lines, and the time for a display device with 320 scan lines is about 50μ second. On the other hand, it takes several ms to charge parasitic capacitance of a data line enough when a display element (e.g. an EL element) has a drive current of about several tens nA and a data current is also about several tens nA. Charging time is proportional to a current value; therefore, by calculations, a data current need to be about a hundred times as large as a current value supplied to a display element in order to write a data current to a pixel within several tens μ seconds. That is, in the case where a data current is written in the way described in Patent Document 1, a capacitance value of a threshold holding capacitor Ct is required to be about ten times as large as that of a Vgs (data) holding capacitor Cs. Cs is required to have a certain amount of capacitance in order to hold Vgs (data); therefore, an area of Ct is required to be larger to increase a data current.

However, the proportion of the area of Ct to an area of a pixel becomes larger as the area of Ct becomes larger, and an area (referred to as aperture ratio) where a light emitting area of a display element occupies in the pixel area is decreased. If Ct is required to be about ten times as large as Cs, a decrease in aperture ratio is a serious problem. Luminance becomes lower because of a decrease in aperture ratio even if the same voltage and a current with the same current density as when the aperture ratio is high, are supplied to a display element. To get the same luminance, a higher voltage is required to be applied to a display element so that a current with a higher current density is supplied to a display element, which causes higher power consumption. In addition, there is a problem in reliability and lifetime of a display element when a current with a higher current density is supplied to a display element.

As described above, when program time is shortened to be within normal program time by using the pixel structure of Patent Document 1, Ct is required to be larger; therefore, a decrease in aperture ratio of a pixel is occurred. A decrease in aperture ration causes a problem such as luminance, power consumption, reliability, and lifetime.

In view of the foregoing problems, the present invention provides a current input type pixel circuit, which has shorter program time and high aperture ratio of a pixel.

In view of the forgoing subject in the invention, a display element functions as a capacitor. A threshold voltage of a transistor, which drives a display element, can be written to the capacitor. Therefore, the threshold voltage of a transistor can be written without providing a capacitor for holding a threshold value.

Hereinafter, description is made of a specific structure of the invention.

One mode of the invention is a display device including a plurality of data lines for supplying a data current, a plurality of scan lines for transmitting a selection signal, a pixel portion including a plurality of pixel circuits which are connected to data lines and scan lines. Each pixel circuit includes a display element which emits light with luminance corresponding to a data current, a first transistor which supplies a data current to the display element and has a source electrode, a drain electrode, and a gate electrode, a first power supply line on a high potential side, which is the same potential as an anode of the display element, a second power supply line on a low potential side, which is the same potential as a cathode of the display element, a first capacitor for holding a voltage between the source electrode and the gate electrode of the first transistor, a second transistor for selecting a connection between the drain electrode and the gate electrode of the first transistor, a third transistor for selecting a pixel circuit to which a data current is written by selecting a connection between the data line and the pixel circuit, a fourth transistor for selecting a connection between the first transistor and the display element, and a fifth transistor selecting a connection between the capacitor and the display element. The display element functions as a second capacitor.

Another mode of the invention is a display device including a plurality of data lines for supplying a data current, a plurality of scan lines for transmitting a selection signal, a pixel portion including a plurality of pixel circuits which are connected to data lines and scan lines. Each pixel circuit includes a display element which emits light with luminance corresponding to a data current, a first transistor which supplies a data current to the display element and has a source electrode, a drain electrode, and gate electrode, a first power supply line and a second power supply line, in either of which a potential changes, a first capacitor for holding a voltage between the source electrode and the gate electrode of the first transistor, a second transistor for selecting a connection between the drain electrode and the gate electrode of the first transistor, a third transistor for selecting a pixel circuit to which a data current is written by selecting a connection between the data line and the pixel circuit, a fourth transistor for selecting a connection between the first transistor and the display element, and a fifth transistor for selecting a connection between the first capacitor and the display element. The display element functions as a second capacitor.

Another mode of the invention is a display device including a data line driver circuit, a plurality of data lines connected to the data line driver circuit, a scan line driver circuit, a plurality of scan lines connected to the scan line driver circuit, a pixel portion including a plurality of pixel circuits connected to the data lines and the scan lines. Each pixel circuit includes a display element which emits light with luminance corresponding to a data current which is supplied from the data lines, a first transistor which supplies the data current to the display element and has a source electrode, a drain electrode, and a gate electrode, a first power supply line and a second power supply line, in either of which a potential changes, a first capacitor for holding a voltage between the source electrode and the gate electrode of the first transistor, a second transistor which is controlled by the scan line driver circuit and selects a connection between the drain electrode and the gate electrode of the first transistor, a third transistor for selecting a pixel circuit to which the data current is written by selecting a connection between the data line and the pixel circuit, a fourth transistor for selecting a connection between the first transistor and the display element, and a fifth transistor for selecting a connection between the first capacitor and the display element. The display element functions as a second capacitor.

Another mode of the invention is a driving method of a display device including a first transistor, a second transistor connected to the first transistor, a third transistor provided between the first transistor and a current source, a display element, a fourth transistor and a fifth transistor which are provided between the display element and the first transistor. A light emitting period for which the display element is emitted after a threshold writing period for storing a charge in the display element is provided within one frame period. In the threshold writing period, the first transistor is turned on, the second transistor is turned on, the third transistor is turned off, the fourth transistor is turned off, and the fifth transistor is turned on. In the light emitting period, the second transistor is turned off, the third transistor is turned off, the fourth transistor is turned on, and the fifth transistor is turned off.

Another mode of the invention is a driving method of a display device including a first transistor, a second transistor connected to the first transistor, a capacitor connected to the first transistor and a power supply line, a third transistor provided between the first transistor and a current source, a display element, a fourth transistor and a fifth transistor which are provided between the display element and the first transistor. A light emitting period for which the display element is emitted is provided after a Cs rewriting period for dividing a charge into the display element and the capacitor within one frame period. In the Cs rewriting period, the second transistor is turned off, the third transistor is turned off, the fourth transistor is turned off, and the fifth transistor is turned on. In the light emitting period, the second transistor is turned off, the third transistor is turned off, the fourth transistor is turned on, and the fifth transistor is turned off.

Another mode of the invention is a driving method of a display device including a first transistor, a second transistor connected to the first transistor, a third transistor provided between the first transistor and a current source, a display element, a fourth transistor and a fifth transistor which are provided between the display element and the first transistor. A light emitting period for which the display element is emitted is provided after a threshold writing period for storing a charge in the display element within one frame period. In the threshold writing period, the first transistor is turned on, the second transistor is turned on, the third transistor is turned off, the fourth transistor is turned off, and the fifth transistor is turned on, and a potential of a power supply line on a cathode side of the display element is the same or almost the same as a potential of a power supply line on an anode side of the display element. In the light emitting period, the first transistor is turned on, the second transistor is turned off, the third transistor is turned off, the fourth transistor is turned on, and the fifth transistor is turned off, and a potential of a power supply line on a cathode side of the display element is lower than a potential of a power supply line on an anode side of the display element.

Another mode of the invention is a driving method of a display device including a first transistor, a second transistor connected to the first transistor, a capacitor connected to the first transistor and a power supply line, a third transistor provided between the first transistor and a current source, a display element, a fourth transistor and a fifth transistor which are provided between the display element and the first transistor. A light emitting period for which the display element is emitted is provided after a Cs rewriting period for dividing a charge into the display element and the capacitor within one frame period. In the Cs rewriting period, the second transistor is turned off, the third transistor is turned off, the fourth transistor is turned off, and the fifth transistor is turned on, and a potential of a power supply line on a cathode side of the display element is the same or almost the same as a potential of a power supply line on an anode side of the display element. In the light emitting period which comes after the Cs rewriting period, the second transistor is turned off, the third transistor is turned off, the fourth transistor is turned on, and the fifth transistor is turned off, and a potential of a power supply line on a cathode side of the display element is lower than a potential of a power supply line on an anode side of the display element.

In the invention, a driving method of a display device includes first to fifth transistors having the same polarity.

In the invention, a first transistor is a p-channel transistor, and one of a source electrode and drain electrode of the first transistor, which has a higher potential when a display element emits light, may be connected to a first power supply line.

In the invention, a first transistor is an n-channel transistor, and one of a source electrode and drain electrode of the first transistor, which has a lower potential when a display element emits light, may be connected to a first power supply line.

Another mode of the invention is a display device including first, second and third wires, a first capacitor, a display element, and first to fifth transistors. A gate electrode of the first transistor is connected to the first wire through the first capacitor. A first terminal of the first transistor is connected to the first wire. A second terminal of the first transistor is connected to the gate electrode of the first transistor through the second transistor and connected to the third wire through the third transistor. A first electrode of the display element is connected to the second terminal of the first transistor through the fourth transistor and connected to one electrode of the first capacitor through the fifth transistor.

Another mode of the invention is a driving method of a display device with first to fourth periods within one frame period. The display device includes a first capacitor, a display element, first to fifth transistors, and first and second wires. In the first period, a charge is accumulated in the display element. In the second period, a charge is accumulated in the capacitor. In the third period, one electrode of the first capacitor and the first wire are electrically connected, the other electrode of the first capacitor and a first terminal of the fifth transistor are electrically connected, a second terminal of the fifth transistor and one electrode of the display element are electrically connected, the other electrode of the display element and the second wire are electrically connected, and the fifth transistor is turned on, thereby the charge accumulated in the display element and the charge accumulated in the first capacitor are divided into the display element and the first capacitor. In the fourth period, a first terminal of the first transistor and the first wire are electrically connected, a second terminal of the first transistor and a first terminal of the fourth transistor are electrically connected, the fourth transistor and one electrode of the display element are electrically connected, the other electrode of the display element and the second wire are electrically connected, and the first and fourth transistors are turned on, thereby the display element emits light.

In the invention, a potential of a first wire connected to a cathode side of a display element is the same or almost the same as a potential of a second wire connected to an anode side of the display element in first to third periods. In a forth period, a potential of the first wire connected to a cathode side of the display element is lower than a potential of the second wire connected to an anode side of the display element.

In the invention, a display element also functions as a second capacitor.

In the invention, a potential of one of first and second wires changes.

In the invention, first to fifth transistors may have the same polarity.

In the invention, a first transistor is a p-channel transistor.

In the invention, a first transistor is an n-channel transistor.

As described above, a threshold holding capacitor Ct is replaced by capacitance Cel of a display element; therefore, a data current may be increased compared to a drive current of the display element without providing Ct. In addition, an aperture ratio can be increased because Ct is not provided in a pixel. When the aperture ratio is high, the capacitance Cel of the display element becomes large; therefore, a data current may be further increased. In this manner, an increase in aperture ratio leads to an increase in data current, which generates a synergistic and significant effect.

BRIEF DESCRIPTION OF DRAWINGS

FIGS. 15A to 15E are diagrams each showing structures of an EL element of the invention.

BEST MODE FOR CARRYING OUT THE INVENTION

Although the invention will be fully described by way of embodiment modes with reference to the accompanying drawings, it is to be understood that various changes and modifications will be apparent to those skilled in the art. Therefore, unless such changes and modifications depart from the scope of the invention, they should be construed as being included therein.

Note that in the specification, a connection means being electrically connected unless specifically described. A disconnection means not being connected and being electrically separated.

Embodiment Mode 1

Figure 3:
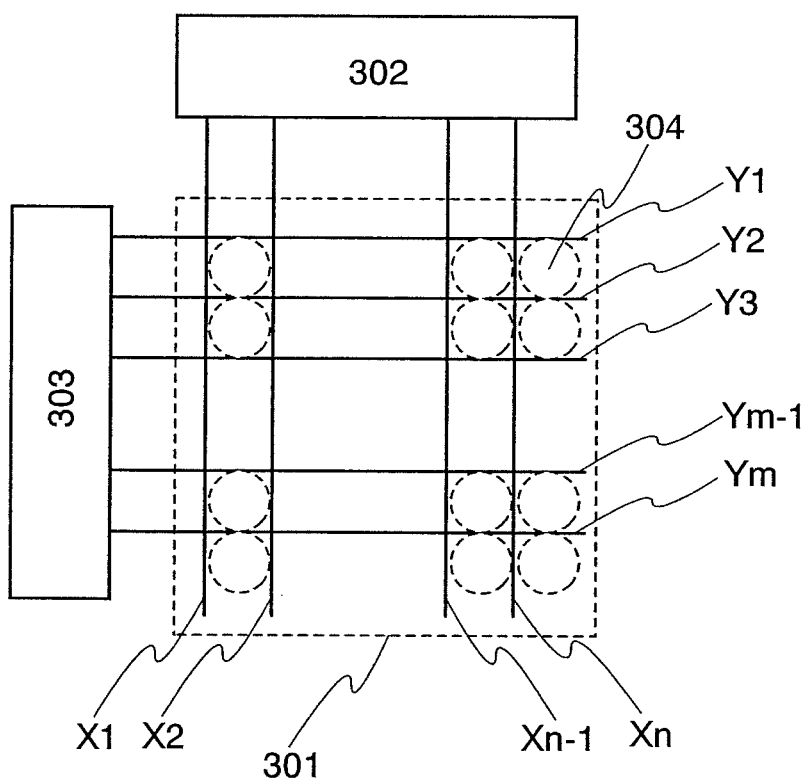
FIG. 3 is a diagram showing a structure of a display device of the invention.

In this embodiment mode, first, description is made of a display device of the invention with reference to FIG. 3. The display element of the invention includes a data line driver circuit 302 as a peripheral driver circuit, a scan line driver circuit 303, n data lines (X1 to Xn) (n is an integer) driven by the data line driver circuit 302, m scan lines (Y1 to Ym) (m is an integer) driven by the scan line driver circuit 303, a plurality of pixel circuits 304 arranged in a position where the m scan lines (m is more than one) and the n data lines cross, and a pixel portion 301 including the plurality of pixel circuits 304. A selection signal is transmitted by the scan lines, and a data current for showing an image signal flows through the data lines. Note that although FIG. 3 shows a case where one pixel circuit 304 is provided with one data line and one scan line, the invention is not limited to this, and one pixel circuit 304 may be provided with a plurality of scan lines and data lines. As described above, the number of pixels, to which a data current is written simultaneously, can be increased, and writing time can be reduced. In addition, the number of driver circuits is not limited in the invention, and a plurality of data line driver circuits and scan line driver circuits may be provided.

Figure 1:
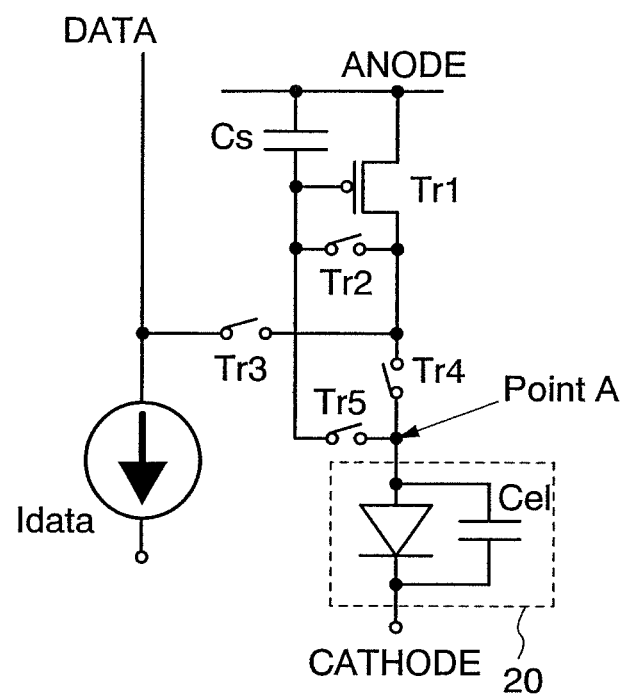
FIG. 1 is a diagram showing a pixel circuit of a display device of the invention.

Next, description is made of a structure of the pixel circuit 304 with reference to FIG. 1. The plurality of pixel circuits 304 each include a first power supply line ANODE, a second power supply line CATHODE, a data line DATA for supplying a data current Idata, a display element which also functions as a capacitor Cel, a switch element Tr3 for selecting a pixel to which Idata is written, a first transistor (also referred to as a driving transistor) Tr1 which is connected to the display element in series and controls a current flowing to the display element, a capacitor Cs which is connected to a gate electrode of the driving transistor Tr1 and holds a voltage between a gate and a source (gate-source voltage) Vgs (data) high enough to supply a current value of Idata when Idata is supplied to the driving transistor Tr1, a switch element Tr2 which connects or disconnects between the gate electrode and a drain electrode of the driving transistor Tr1, a switch element Tr4 which is connected to the display element in series and connects or disconnects between the display element and the driving transistor Tr1, a switch element Tr5 which connects and disconnects between the capacitor Cs and the display element. A circuit diagram shows a circuit including an EL element 20 provided as a display element, a light emitting diode and a capacitor are provided; however, the EL element functions both as a light emitting element and as a capacitor. The pixel circuit of the invention can store a threshold voltage of the driving transistor Tr1 without providing a threshold holding capacitor Ct by using the capacitor Cel of the EL element. Note that in the pixel circuit 304, the display element can be driven by changing a potential of the first power supply line ANODE and a potential of the second power supply line CATHODE. In addition, the second power supply line CATHODE may be connected to all pixel circuits in common.

An element of various modes may be employed as an element which functions as a switch, such as an electrical switch and a mechanical switch. That is, as long as a flow of current can be controlled, it is not limited to a specific form of a switch, and various elements may be used. For example, a transistor, a diode (a PN diode, a PIN diode, a Schottky diode, a diode-connected transistor, or the like), or a logic circuit of a combination thereof may be employed. When a transistor is used as a switch, a thin film transistor (also referred to as TFT) may be employed. A thin film transistor may also be employed as a driving transistor. In the case where a transistor is used as a switch, polarity (conductivity type) thereof may be either p-channel or n-channel, and all transistors may have the same polarity. Generally, a p-channel transistor has high reliability, and an n-channel transistor has a larger on current. Due to the aforementioned, either of the polarity is selected. However, a transistor with a smaller off current is preferably employed when it is preferable that an off current is smaller. As for a transistor with small off current, a transistor provided with an LDD region, a transistor with a multi-gate structure, and the like may be used. In addition, it is preferable to employ an n-channel transistor when operating in a state where a potential of a source terminal of the transistor, which operates as a switch, is close to a low potential side power source (Vss, GND, 0V, or the like), whereas it is preferable to employ a p-channel transistor when operating in a state where a potential of the source terminal of the transistor is close to a high potential side power source (Vdd or the like). This is because the transistor can be easily operated as a switch since an absolute value of a gate-source voltage thereof can be set large. Note that a CMOS switch may also be applied by using both n-channel and p-channel transistors. In the case where a CMOS switch is employed, the switch can be operated appropriately even when circumstances are changed in such a manner that a voltage inputted through the switch (in other words, a input voltage) is higher or lower than an output voltage.

However, polarity of the driving transistor Tr1, which controls a current flowing to the EL element, is decided by a potential of the first power supply line ANODE which is connected to the driving transistor Tr1 when the EL element 20 emits light. For example, in the case where an anode of the EL element 20 is connected to the driving transistor Tr1 as shown in FIG. 1, a current passes through the first power supply line ANODE, the driving transistor Tr1, and the EL element 20 in this order when the EL element 20 emits light. At this time, the first power supply line ANODE connected to the driving transistor Tr1 has the highest potential in this current path. The driving transistor Tr1 is a p-channel transistor in the case where the first power supply line ANODE has a high potential, and the driving transistor Tr1 is an n-channel transistor in the case where the first power supply line ANODE has a low potential. This is because a current value supplied to a transistor which operates in saturation region changes depending on a gate-source voltage thereof; therefore, it is easier to control a current value when a source electrode is connected to a power supply line if a current value is kept constant. Note that a source electrode, which is one of source and drain electrodes, is an electrode on a high potential side in the case of a p-channel transistor, and an electrode on a low potential side in the case of an n-channel transistor.

The polarity of the driving transistor Tr1 and each switching transistor are not necessarily the same. However, if the polarity of the transistors are all the same, it is favorable for cost reduction because the number of processes for manufacturing the transistors is reduced.

Figure 7:
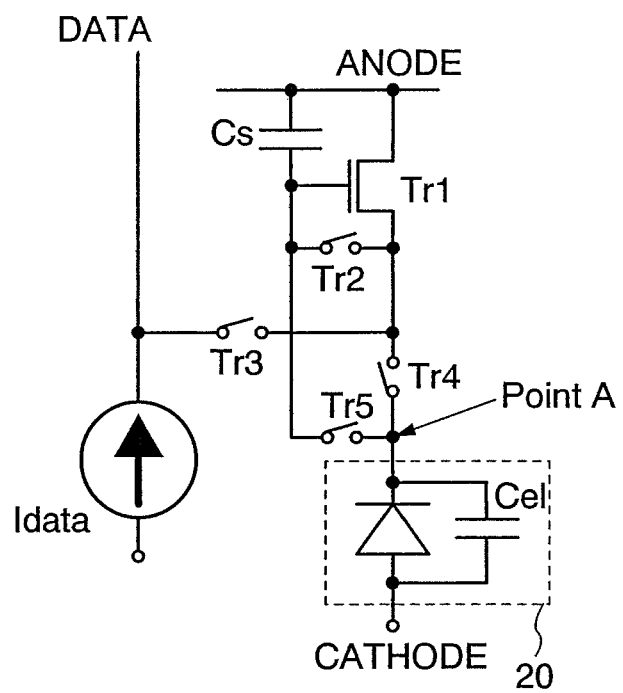
FIG. 7 is a diagram showing a pixel circuit of a display device of the invention.
Figure 8:
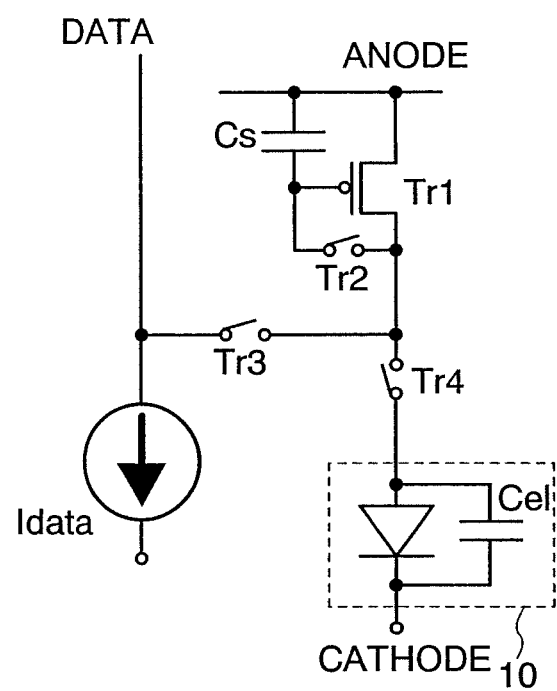
FIG. 8 is a diagram showing a pixel circuit of a display device.

In addition, it is further favorable for cost reduction because an amorphous silicon TFT, which can be manufactured with a large area and at low cost, can be employed as the driving transistor Tr1 and each switch element. In the case of using an amorphous silicon TFT, polarity of transistors are preferably all n-channel type. FIG. 7 shows a pixel circuit using all n-channel transistors in the pixel circuit in FIG. 1.

Note that in this embodiment mode, description is made that the polarity of a switching transistor and a driving transistor are all p-channel type.

Figure 2:
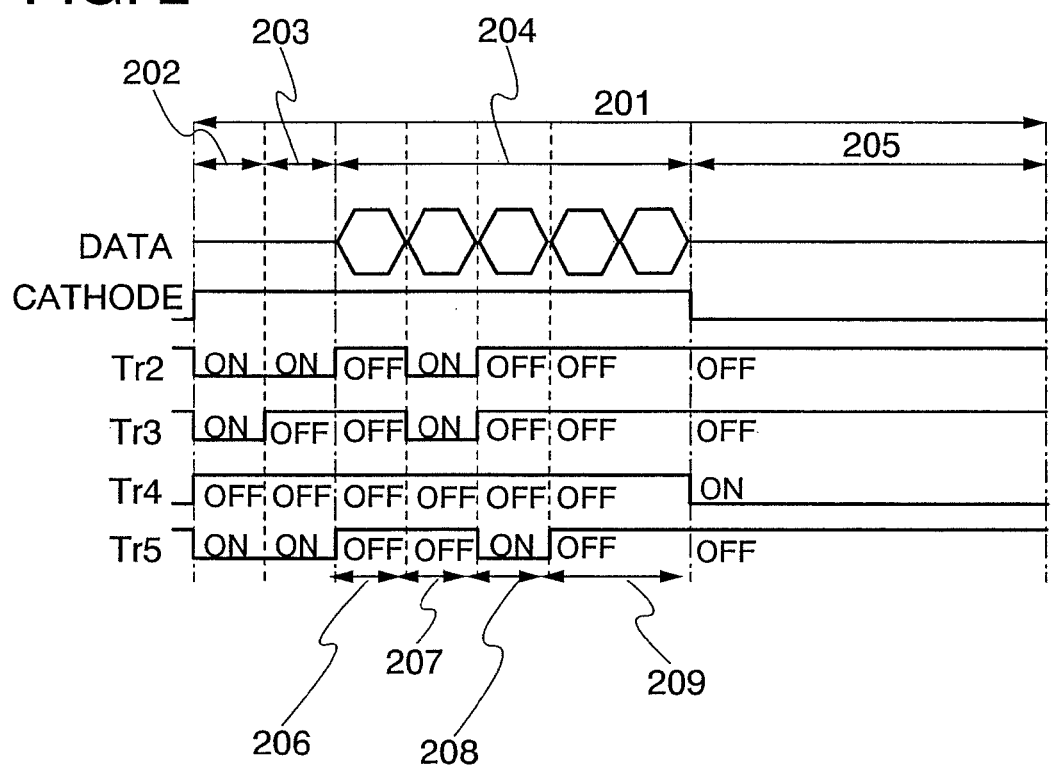
FIG. 2 is a diagram showing a driving method of a pixel circuit of a display device of the invention.

Next, a driving method of the pixel circuit of this embodiment mode shown in FIG. 1 is described with reference to FIG. 2. FIG. 2 is a timing chart, which shows a change of potential of the data line DATA, the second power supply line CATHODE, each gate electrode of switching transistors Tr2, Tr3, Tr4 and Tr5 with a horizontal axis representing time.

A drive of the display device of this embodiment mode includes one frame period 201 having an initialization period 202, a threshold writing period 203, an address period 204, and a light emitting period 205 with the one frame period 201 as one unit. Here, the initialization period 202 is a period in which a threshold writing operation is performed appropriately in the threshold writing period 203. The threshold writing period 203 is a period for writing a threshold voltage of the driving transistor Tr1 to the capacitor Cel of the EL element 20. The address period 204 is a period for writing a data current to all pixels. Note that by connecting the capacitor Cel of the EL element 20 to which the threshold voltage of the driving transistor Tr1 is written, to the capacitor Cs to which a voltage Vgs (data) between a gate and source of the driving transistor Tr1 (referred to as a gate-source voltage) is written corresponding to an data current Idata and dividing a charge therebetween, a data current can be written to a pixel with a large data current. The light emitting period 205 is a period in which the EL element 20 emits light in accordance with the data current written in the address period 204.

First, a potential of each signal line is described. A potential of the data line DATA may be lower than that of the first power supply line ANODE by an absolute value of the threshold voltage of the driving transistor Tr1 in the initialization period 202. If this condition is not satisfied, the driving transistor Tr1 is not turned on because the gate-source voltage thereof does not become equal to or higher than the threshold voltage in the threshold writing period 203, and the threshold voltage cannot be written because a current does not flow to the capacitor Cel of the EL element 20. Note that in the case of using an n-channel transistor as the driving transistor Tr1, the potential of the data line DATA in the initialization period 202 may be equal to or higher than that of the first power supply line ANODE by the absolute value of the threshold voltage of the driving transistor Tr1.

In the address period 204, the potential of the data line DATA is decided by a current value generated in a peripheral driver circuit in accordance with luminance data from image data and by an electrical characteristic of the driving transistor Tr1. That is, a potential of the data line DATA is different from time to time; therefore, a value is not decided in FIG. 2. In addition, a potential of the data line DATA in the light emitting period 205 is arbitrary because a state of the EL element 20 is not affected. That is, it may be only in the initialization period 202 that an electrical state of the data line DATA is decided by a potential.

In the initialization period 202, the threshold writing period 203, and the address period 204, a potential of the second power supply line CATHODE may be high, and the same or almost the same as that of the first power supply line ANODE thereof. In the light emitting period 205, the potential of the second power supply line CATHODE is low and lower than that of the first power supply line ANODE thereof, and may be a potential which makes the driving transistor Tr1 operate in a saturation region when the switch Tr4 is turned on.

Although a potential of the first power supply line ANODE is not shown in FIG. 2, it is preferable to have a certain potential in view of reducing power consumption and noise.

Concerning a potential of a signal inputted to the switching transistors Tr2, Tr3, Tr4, and Tr5, it may be a potential (a potential operating in a saturation region) at which a switch element is sufficiently turned on or off. It is preferable that an amplitude of a signal inputted to the gate electrode is smaller to such a degree that a function as a switch is not damaged in view of reducing power consumption and noise.

A pixel in FIG. 1 is operated by an input signal shown in the timing chart of FIG. 2 as described below. First, a light emitting period 205A of a former frame is shifted to the initialization period 202 of a concerned frame. At that time, a potential of the second power supply line CATHODE is raised up to a potential of the first power supply line ANODE. In addition, almost simultaneously, a switch element is changed so that a point A, the data line DATA, the gate electrode and drain electrode of the driving transistor Tr1 are electrically connected, and a potential of the data line DATA is set lower than the potential of the first power supply line ANODE by an absolute value of the threshold voltage of the driving transistor Tr1. A condition of each switch element is arbitrary in order to realize this state, and as shown by the initialization period 202 in FIG. 2, for example, the switch elements Tr2, Tr3 and Tr5 may be turned on and Tr4 may be turned off. In realizing such a state, a potential of the point A, the gate electrode and drain electrode of the driving transistor Tr1 are initialized to a value lower than the potential of the first power supply line ANODE by the absolute value of the threshold voltage of the driving transistor Tr1.

Note that the potential of the second power supply line CATHODE is lower than that of the point A (also referred to as reverse bias) in the initialization period 202; therefore, a forward current is not applied to the EL element 20, which emits no light. In addition, the EL element 20 can obtain a longer lifetime and higher reliability by applying a reverse bias voltage.

By applying the reverse bias voltage to the EL element 20, a defect and reliability of the EL element 20 can be improved. The EL element 20 sometimes causes an initial defect of a short circuit between an anode and a cathode owing to adhesion of foreign materials, a pinhole caused by a minor protrusion of the anode or the cathode, or heterogeneity of deposition of an electroluminescent material. When such an initial defect occurs, lighting and non-lighting are not performed in accordance with a signal, and most current flows to a short-circuited element. As a result, display of an image is not performed well. The defect may also happen in an arbitrary pixel.

Consequently, when the reverse bias voltage is applied to the EL element 20 as in this embodiment mode, a local current is supplied to a short-circuited part, and the short-circuited part produces heat and can be oxidized or carbonized. Therefore, the short-circuited part can be insulated, a current is supplied to a region except the short-circuited part, and thereby the EL element 20 can be operated normally. As described above, if the initial defect occurs, it can be resolved by applying the reverse bias voltage. Note that such a short-circuited part can be insulated before shipment. For example, the switch elements Tr3 and Tr4 of all pixels are turned on, and the potential of the data line DATA is made lower than the potential of the second power supply line CATHODE; therefore, the reverse bias can be applied before shipment.

A short circuit between an anode and a cathode may occur as time passes in addition to an initial defect. Such a defect is also called a progressive defect. By applying the reverse bias voltage to the EL element 20 as in this embodiment mode, the progressive defect can be resolved if it occur, and the EL element 20 can be operated normally.

In addition, image burn-in can be prevented by applying the reverse bias voltage. The image burn-in occurs in accordance with a deterioration state of the EL element 20. The deterioration state can be decreased by applying the reverse bias voltage; therefore, the image burn-in can be prevented.

Generally, the deterioration of the EL element 20 progresses in an early stage, and a proceeding of deterioration is lessened as time passes. That is, the EL element 20 which is once deteriorated is less likely to be further deteriorated. As a result, the deterioration state of the EL element 20 varies. For resolving this, all the EL elements 20 may emit light before shipment or when an image is not displayed. At this time, deterioration can be caused even in an element which is not deteriorated, and the deterioration state of all the EL element 20 can be averaged.

Note that a timing for raising the potential of the second power supply line CATHODE and a timing for changing each switch element may be whether each switch element is switched after the potential of the second power supply line CATHODE is raised, or each switch element is switched before the potential of the second power supply line CATHODE is raised so as not to change the potential of the point A a lot. This is because time for stabilizing the potential is considered since parasitic capacitance connected to the second power supply line CATHODE is large. Note that an object of providing the initialization period 202 is to certainly carry out an threshold writing operation in the threshold writing period 203 described below, thus it is not always required to provide the initialization period 202 if the threshold writing operation is certainly carried out. However, it is preferable that the initialization period 202 is provided for certainly performing the threshold writing operation because the potential of the point A is changed as the potential of the second power supply line CATHODE is raised. In this embodiment mode, although description is made of the case where the data line DATA is employed for initialization, another wire such as an exclusive power supply line or a scan line may be employed for initialization instead of the data line DATA.

Next, after the potential of the point A is set lower than the potential of the first power supply line ANODE by the absolute value of the threshold voltage of the driving transistor Tr1, a period is shifted to a period (corresponding to the threshold writing period 203) for changing a voltage, which is supplied to both ends of electrodes of the capacitor Cel, into the threshold voltage of the driving transistor Tr1. At this time, a switch element is switched so that the point A, the gate electrode and the drain electrode of the driving transistor Tr1 are electrically connected and become a floating state. A condition of each switch element for realizing this state is arbitrary. For example, the switch elements Tr2 and Tr5 are turned on, and the switch elements Tr3 and Tr4 are turned off as shown in the threshold writing period 203 of FIG. 2. By realizing such a state, a current flows to the capacitor Cs from the first power supply line ANODE through the driving transistor Tr1. The driving transistor Tr1 is turned off and a current stops flowing when the gate-source voltage of the driving transistor Tr1 becomes the threshold voltage thereof.

At this time, the point A, the gate electrode and drain electrode of the driving transistor Tr1 are electrically connected; therefore, the potential of the point A is lower than the potential of the first power supply line ANODE by the absolute value of the threshold voltage of the driving transistor Tr1. The voltage applying to the both electrodes of the capacitor Cs at this time becomes the threshold voltage of the driving transistor Tr1. On the other hand, the potential of the point A is lower than the potential of the first power supply line ANODE by the absolute value of the threshold voltage of the driving transistor Tr1 regardless of the potential of the second power supply line CATHODE; therefore, the voltage applying to the both electrodes of the capacitor Cel becomes the threshold voltage of the driving transistor Tr1 in the case where the potential of the second power supply line CATHODE is the same or almost the same as the potential of the first power supply line ANODE. In addition, it is preferable not to change the potential of the second power supply line CATHODE from that in the initialization period 202 because the potential of the point A also changes as the potential of the second power supply line CATHODE changes.

Next, a period is shifted to the address period 204 including a period for writing a data current by each scan line. In the address period 204, a period before selecting the pixel is called a pre-writing period 206, a period for writing a data current to the pixel is called a data writing period 207, a period for rewriting a voltage applied to the capacitor Cs of the pixel by a voltage held in the capacitance Cel is called a Cs rewriting period 208, and a period after the Cs rewriting period 208 is over is called a post-rewriting period 209. In the pixel circuit of the invention, the capacitance Cel of the EL element 20 is applied without providing the threshold holding capacitor Ct, and the Cs rewriting period 208 is provided for rewriting the voltage applied to the capacitor Cs of the pixel by the voltage holding to the capacitance Cel. Note that as a data current is written to each pixel connected to each scan line (Y1 to Ym), a timing and length of each period in the address period 204 shown in FIG. 2 are one example. A timing for the data writing period 207, and a length of the pre-writing period 206 and a length of the post-rewriting period 209 are different depending on each pixel connected to each scan line (Y1 to Ym). Note that in the address period 204, as the potential of the second power supply line CATHODE, the potential of the point A is also changed; therefore, an accurate gate-source voltage of the driving transistor Tr1 cannot be obtained in the Cs rewriting period 208, and it is preferable that the potential of the second power supply line CATHODE is not changed from that in the initialization period 202 and the threshold writing period 203.

In the pre-writing period 206, the point A sets to be a floating state so that the threshold voltage of the driving transistor Tr1 obtained in the aforementioned threshold writing period 203 is held in the capacitor Cel. Each element except for a switch element in the pixel (in particular, the capacitor Cs, the driving transistor Tr1, and the EL element 20) and the data line DATA are set not to be electrically connected so as not to prevent writing to a pixel connected to a selected scan line other than a scan line connected to the concerned pixel. A condition of each switch element for realizing such a state is arbitrary, and for example, the switch elements Tr2, Tr3, Tr4 and Tr5 are turned off as shown in the pre-writing period 206 of FIG. 2.

In the data writing period 207, the point A sets to be a floating state so that the capacitor Cel holds the threshold voltage of the driving transistor Tr1 obtained in the aforementioned threshold writing period 203. The data line DATA and the gate and the drain electrodes of the driving transistor Tr1 are electrically connected to each other, which are prevented from being electrically connected to the other elements except for a switch element. A condition of each switch element for realizing such a state is arbitrary, and for example, the switch elements Tr2 and Tr3 are turned on, and the switch elements Tr4 and Tr5 are turned off as shown in the threshold writing period 203 of FIG. 2. By realizing such a state, the data current Idata flows to the driving transistor Tr1, and the gate-source voltage (Vgs (data)), which is high enough for the driving transistor Tr1 to supply the data current Idata, is supplied to the capacitor Cs.

In the Cs rewriting period 208, the capacitor Cel which holds the threshold voltage of the driving transistor Tr1 obtained in the aforementioned threshold writing period 203 is electrically connected to the capacitor Cs which holds the gate-source voltage high enough for the driving transistor Tr1 to supply the data current Idata, and the point A is prevented from being electrically connected to the other elements except for a switch element (except for the gate electrode of the driving transistor Tr1). A condition of each switch element for realizing such a state is that, for example, the switch elements Tr2, Tr3 and Tr4 are turned off, and the switch element Tr5 is turned on as shown in the Cs rewriting period 208 of FIG. 2. By realizing such a state, the gate-source voltage (also referred to as Vgs (oled)), which is high enough to supply a current Ioled satisfying Formula 2, is supplied to the capacitor Cs. The current Ioled is described by the following formula.

$$Ioled = \left(\frac{Cs}{(Cel+Cs)}\right)^2 \times Idata \qquad \text{[Formula 2]}$$

In the post-rewriting period 209, the gate electrode of the driving transistor Tr1 is set to be a floating state so that the voltage Vgs (oled) applied to the capacitor Cs in the Cs rewriting period 208 can be held, and each element except for a switch element in the pixel (in particular, the capacitor Cs, the driving transistor Tr1, and the EL element 20) and the data line DATA are set not to be electrically connected so as not to prevent writing to a pixel connected to a selected scan line other than a scan line connected to the pixel. A condition of each switch element for realizing such a state is arbitrary, and for example, the switch elements Tr2, Tr3, Tr4 and Tr5 are turned off as shown in the post-rewriting period 209 of FIG. 2.

As described above, in the address period 204, a gate-source voltage, which is high enough to supply a current Ioled corresponding to each luminance, is written to the capacitor Cs in all pixels by writing data sequentially to each scan line (Y1 to Ym). Then, the voltage is shifted in the next one frame period 201 and held in the capacitor Cs. Note that description of the number to divide the address period 204 in FIG. 2 is one example, and this embodiment mode is not limited to this. For example, the number to divide the address period 204 is the same or the almost same as the number of the scan lines. In addition, a plurality of scan lines may be driven using a plurality of the data line driver circuits 302 in order to shorten the address period 204. In the case where two scan lines are driven by using two data line driver circuits 302, for example, the number to divide the address period 204 is half the number of the scan lines.

Next, a period is shifted to the light emitting period 205, in which the EL element 20 emits light in accordance with the gate-source voltage Vgs (oled) of the driving transistor Tr1 held in the aforementioned address period 204. At this time, the driving transistor Tr1 and the EL element 20 are connected in series, and the gate-source voltage Vgs (oled) of the driving transistor Tr1 holding in the aforementioned address period 204 is held; therefore, the gate electrode of the driving transistor Tr1 is set to be a floating state, and an element except for each switch element in each pixel and the data line DATA are set not to be electrically connected. A condition of each switch element is that, for example, the switch element Tr4 is turned on, and the switch elements Tr2, Tr3, and Tr5 are turned off as shown in the light emitting period 205 of FIG. 2. By realizing such a state, the current Ioled satisfying Formula 2 flows to the driving transistor Tr1 and the EL element 20, and the EL element 20 emits light at luminance in accordance with the data current Idata.

Figure 9:
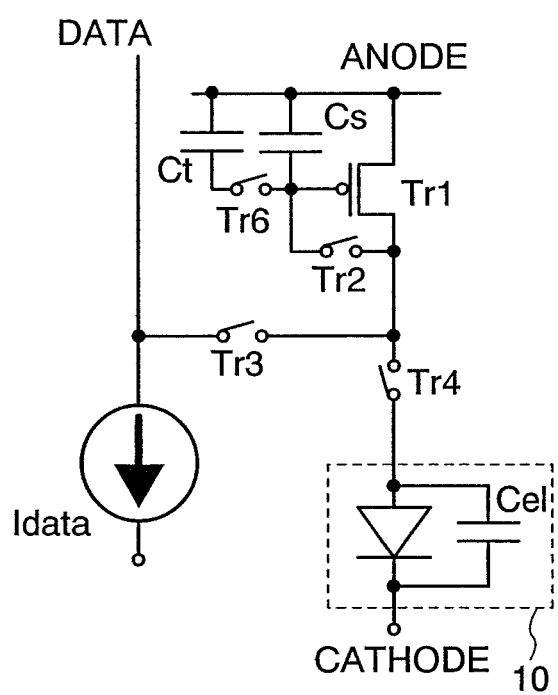
FIG. 9 is a diagram showing a pixel circuit of a display device.

As the pixel circuit and the driving method thereof in this embodiment mode, the threshold holding capacitor Ct is replaced by the capacitance Cel of an EL element. As a result, a data current can be increased in response to a drive current of the EL element without providing Ct. This may be also understood from a comparison of the pixel circuit and the driving method thereof in this embodiment mode with a conventional pixel circuit shown in FIG. 9 and Formula 1, which expresses a current flowing to the EL element 20.

In this embodiment mode, an aperture ratio can be increased because Ct is not provided in a pixel. The increase in aperture ratio leads to an increase in the capacitance Cel of an EL element; therefore, a data current can be further increased. In this manner, the increase in aperture ratio leads to the increase in data current, which generates a synergistic and significant effect.

Embodiment Mode 2

Figure 4A:
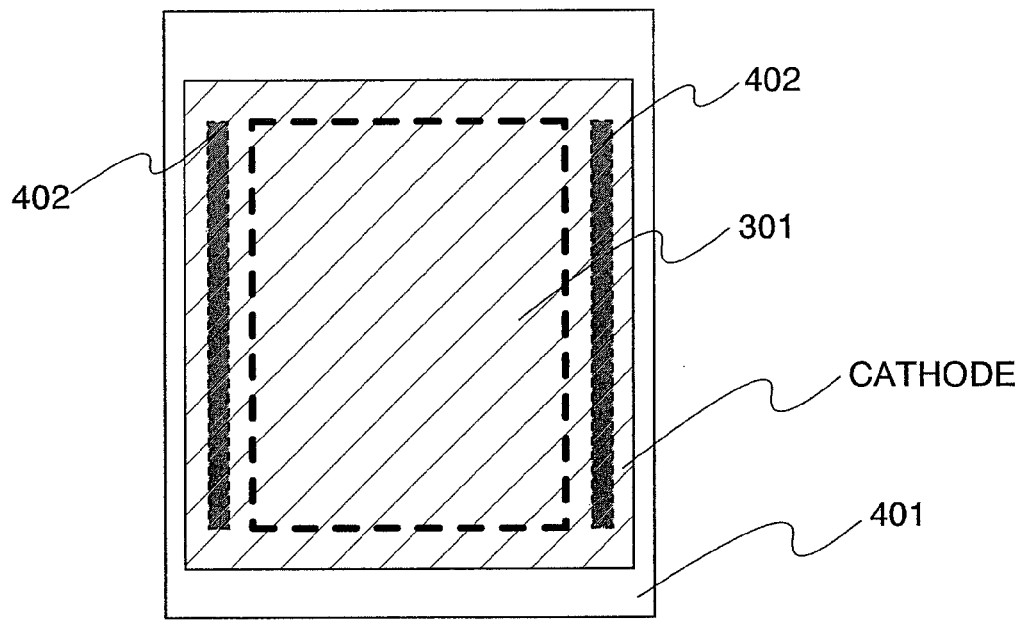
FIGS. 4A and 4B are diagrams each showing a shape of an electrode of a display device of the invention.
Figure 4B:
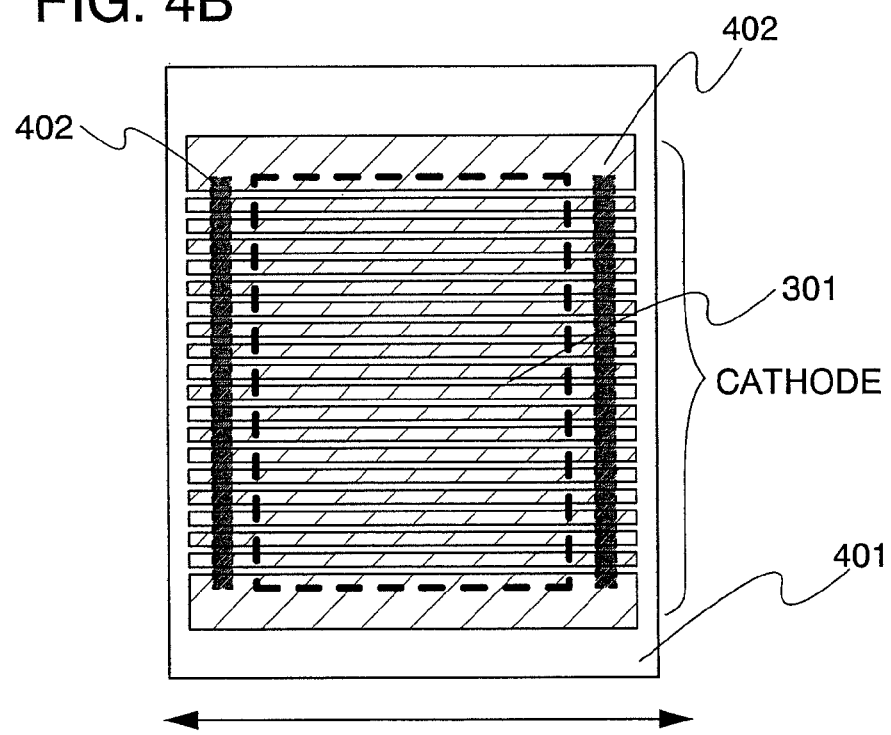
Figure 5:
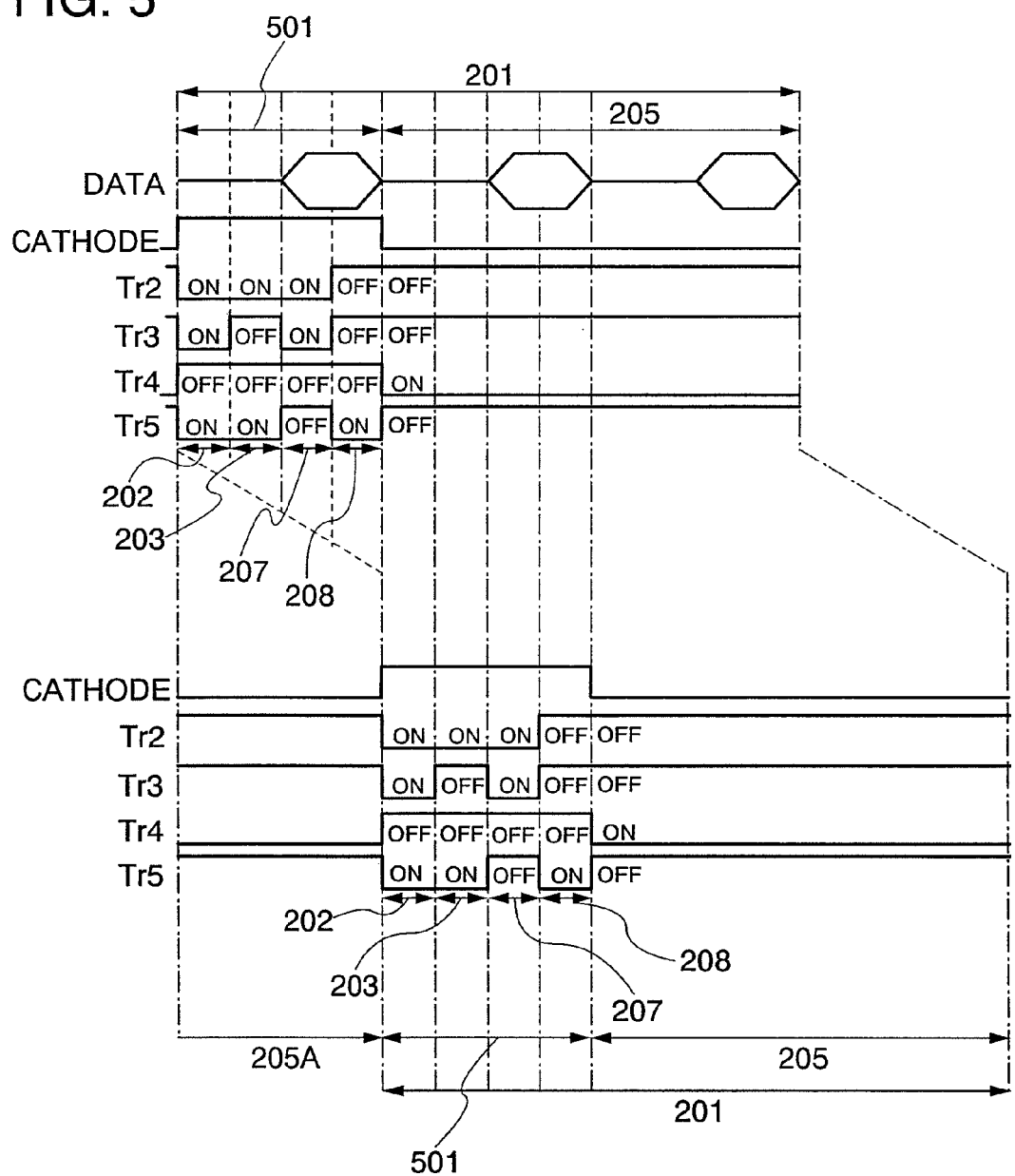
FIG. 5 is a diagram showing a driving method of a pixel circuit of a display device of the invention.

Next, description is made of a second mode of a display device of the invention with reference to FIGS. 4A, 4B, and 5.

A pixel circuit in this embodiment mode may be applied to FIG. 1 explained in Embodiment Mode 1. Note that in this embodiment mode a manufacturing method of the second power supply line CATHODE is different from the mode explained in Embodiment Mode 1, which can generate a particular effect. Description is made of a mode of the second power supply line CATHODE with reference to FIGS. 4A and 4B.

FIG. 4A is a schematic view of the second power supply line CATHODE in the display device explained in the aforementioned Embodiment Mode 1. The second power supply line CATHODE in FIG. 4A has a mode of being connected to all pixel circuits in common as already described in Embodiment Mode 1. A pixel portion 301 is formed over a substrate 401, over which an EL element is formed as a display element, over which a contact region 402 with a lower electrode is formed, over which the second power supply line CATHODE is formed over a whole area by vapor deposition, which can be directly applied to a common electrode.

Note that in the case of using an EL element as a display element, the second power supply line CATHODE may be processed in shape by photolithography; however, it is considered that a damage to an EL element by the process is large. In the case where the second power supply line CATHODE is formed by vapor deposition using a vapor-deposition mask, the second power supply line CATHODE can be processed in shape without giving great damage to the EL element. In this embodiment mode, description is made of the case where the second power supply line CATHODE is processed in shape in parallel to scan lines (Y1 to Ym) represented by an arrow shown in FIG. 4B. Note that it is preferable that the number of dividing the second power supply line CATHODE by processing shape is the same as the number of scan lines, which is one line per one pixel row which is in parallel with the scan line. However, the number of partitions itself is arbitrary, and the number of the second power supply line CATHODE to be processed may be freely decided.

As the region 402 in contact with the second power supply line, it is preferable that the second power supply line CATHODE is controlled individually in a circuit connected to the second power supply line CATHODE or to the lower electrode.

Description is made of a driving method with reference to FIG. 5, which is an operation of the pixel circuit 304 in this embodiment mode and can be realized by making the second power supply line CATHODE peculiar to each scan line. FIG. 5 shows a timing chart of a concerned line and a timing chart of a next line. A line means a pixel group connected to the same scan line.

In this embodiment mode, a structure of the pixel circuit 304 can employ to that of FIG. 1 as in Embodiment Mode 1.

FIG. 5 is a timing chart, which shows a change of potential of the data line DATA, the second power supply line CATHODE, each gate electrode of the switching transistors Tr2, Tr3, Tr4 and Tr5 with a horizontal axis representing time. In a drive of the display device of this embodiment mode, one frame 201 includes a one scan line writing period 501 and a light emitting period 205 as one unit. The one scan line writing period 501 includes a initialization period 202, a threshold writing period 203, a data writing period 207, a Cs rewriting period 208.

When the concerned line finishes light emission in a former frame and shifts to the one scan line writing period 501, the line is rewritten from Vgs of a former line to a Vgs (oled) of a concerned line, which corresponds to a data current through a state of the initialization period 202, the threshold writing period 203, the data writing period 207 and the Cs rewriting period 208, and may be shifted to a light emitting state again.

Here, description of each state in detail is omitted as is already described in Embodiment Mode 1. However, an input signal to the data line DATA is different from that of Embodiment Mode 1 and is required to be a lower value than the first power supply line ANODE by the absolute value of the threshold voltage of the driving transistor Tr1 so as to be initialized individually by each line before writing data to each line. Note that in FIG. 5 the initialization period 202 is just before the threshold writing period 203, however it is not required to be just before the threshold writing period 203 particularly, and initialization may be performed before the threshold writing period 203. For example, the concerned line can be initialized when the data line DATA has a lower value than the first power supply line ANODE by the absolute value of the threshold voltage of the driving transistor Tr1 in two lines before the concerned lines. After initialization, Tr3 is turned off, and the threshold voltage is written to the capacitor Cel of an EL element. Then data writing or the like are performed in a selecting period. In performing as described above, the threshold writing period 203 can be set long enough.

Note that although a length of a horizontal axis shown in FIG. 5 is almost equally spaced, this embodiment mode is not limited to this, and a length of each period may be decided appropriately as needed.

A driving method of this embodiment mode shown in FIG. 5 is characterized by forming the second power supply line CATHODE in parallel with the scan lines. In the case where the second power supply line CATHODE of the concerned line is changed in order to be written to the concerned line, an operation of the lines other than the concerned line is not effected. Therefore, the other lines may continue to emit light with Vgs (oled) being held in accordance with the data current of a former line, while the concerned line is selected and the data current is written thereto. That is, a ratio (duty ratio) of light emitting period within the one frame period 201 is substantially improved. When the duty ratio is high, even momentary luminance of a light emitting element is smaller than that with smaller duty ratio, it is recognized as the same luminance. Therefore, in addition to the effects in Embodiment Mode 1, a driving voltage can be smaller, power consumption can be reduced, and reliability can be improved.

Embodiment Mode 3

Figure 6:
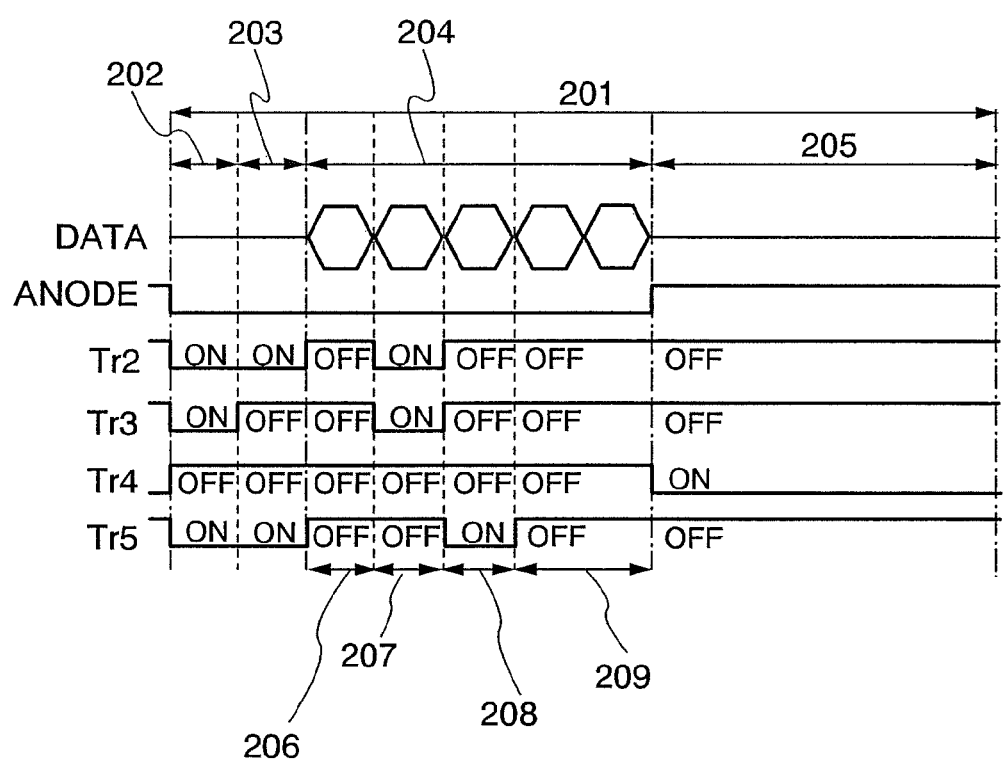
FIG. 6 is a diagram showing a driving method of a pixel circuit of a display device of the invention.

Next, description is made of a third mode of a display device of the invention with reference to FIG. 6. In this embodiment mode, a driving method of the display device by alternating a first power supply line ANODE is described. In this embodiment mode, a second power supply line CATHODE may be connected to all pixels in common, which is described in this embodiment mode. However, the second power supply line CATHODE may be processed in shape in this embodiment mode.

In FIG. 6, an input signal is described in the case where the display device of the invention is driven by alternating the first power supply line ANODE with polarity of all transistors being p-channel. One frame includes the initialization period 202, the threshold writing period 203, the address period 204, the light emitting period 205, which is the same as the drive shown in Embodiment Mode 1, and a performance of circuits in each period is almost the same as well. Therefore, in this embodiment mode, description is mainly made of different points from Embodiment Mode 1.

First, a potential of each signal line is described. In the initialization period 202, the threshold writing period 203, and the address period 204, a potential of the first power supply line ANODE may be low and be the same or almost the same as a potential of the second power supply line CATHODE. In the light emitting period 205, a potential of the first power supply line ANODE may be high and higher than a potential of the second power supply line CATHODE at that time, and may be a potential at which the driving transistor Tr1 operates in a saturation region when the switch element Tr4 is turned on.

A potential of the second power supply line CATHODE is not shown in FIG. 6; however, it is preferable to be a constant potential in view of reducing power consumption and noise.

A potential of a data line DATA in the initialization period 202 may be lower than a potential of the first power supply line ANODE by an absolute value of a threshold voltage of the driving transistor Tr1. If this condition is not satisfied, the driving transistor Tr1 is not turned on because a gate-source voltage thereof is not more than the threshold voltage in the threshold writing period 203, and the threshold voltage cannot be written to the EL element 20 because a current does not flow to the capacitor Cel of the EL element 20. Note that in the case of using an n-channel transistor as the driving transistor Tr1, the potential of the data line DATA in the initialization period 202 may be equal to or higher than that of the first power supply line ANODE by the absolute value of the threshold transistor of the driving transistor Tr1.

A potential of the data line DATA in the address period 204 is decided by a value of a data current generated in a peripheral driver circuit in accordance with luminance data from image data and by an electrical characteristic of the driving transistor Tr1. That is, a potential of the data line DATA is different from time to time, so that a value is not decided in FIG. 6. In addition, a potential of the data line DATA in the light emitting period 205 is arbitrary because a state of the EL element 20 is not affected. That is, it may be only in the initialization period 202 that an electrical state of the data line DATA is decided by a potential.

A potential of a signal inputted to the switching transistors Tr2, Tr3, Tr4 and Tr5 may be a potential (potential operating in a linear region) at which the switch element is sufficiently turned on or off. An amplitude of a signal inputted to a gate electrode is preferably smaller to such a degree that a function as a switch is not damaged in view of reducing power consumption and noise.

In this embodiment mode, a different part of an operation from that in Embodiment Mode 1 is that the potential of the second power supply line CATHODE is not changed and the potential of the first power supply line ANODE is changed so as to be equal to the potential of the second power supply line CATHODE. There are the following three differences in specific. First, when the light emitting period 205 is shifted to the initialization period 202, the potential of the first power supply line ANODE is lowered. Second, when the address period 204 is shifted to the light emitting period 205, the potential of the first power supply line ANODE is raised. And third, in the initialization period 202, the threshold writing period 203, and the address period 204, the potential of the first power supply line ANODE is set to be the same or almost the same as the potential of the second power supply line CATHODE, of which potential is low. However, the third difference described above does not affect to a circuit operation; therefore, the circuit operations in this embodiment mode and Embodiment Mode 1 are not different. Therefore, description of the circuit operation is omitted since it is the same as that in Embodiment Mode 1.

Description is made of the operation on a first point at which the potential of the first power supply line ANODE is lowered when a light emitting period 205A of a former frame is shifted to the initialization period 202 of the concerned frame. When the light emitting period 205A of the former frame is shifted to the initialization period 202 of the concerned frame, the switch elements Tr2, Tr3 and Tr5 which are off are turned on, and Tr4 which is on is turned off. And almost simultaneously, the potential of the first power supply line ANODE is lowered so as to be almost equal to the potential of the second power supply line CATHODE, and the potential of the data line DATA is lowered than the lower potential (Low state) of the first power supply line ANODE by the absolute value of the threshold voltage of the driving transistor Tr1. In Embodiment Mode 1, the potential of the data line DATA in initialization is lowered than the high potential (High state) of the second power supply line CATHODE by the absolute value of the threshold voltage of the driving transistor Tr1, which is different from this embodiment mode. Note that in the case where the driving transistor Tr1 is an n-channel transistor, the potential of the data line DATA is raised than the lower potential of the first power supply line ANODE by the absolute value of the threshold voltage of the driving transistor Tr1 in this embodiment mode. In Embodiment Mode 1, in the case where the driving transistor Tr1 is an n-channel transistor, the potential of the data line DATA is raised than the higher potential of the second power supply line CATHODE by the absolute value of the threshold voltage of the driving transistor Tr1, which is different from this embodiment mode.

Description is made of the operation on a second point at which the potential of the first power supply line ANODE is raised when the address period 204 is shifted to the light emitting period 205. When the address period 204 is shifted to the light emitting period 205, the switch elements Tr2 and Tr3 remain to be off, Tr4 which is on is turned off, and Tr5 remains to be off or is turned off. After the switch element Tr5 is accurately turned off so that one electrode of the capacitor Cs is in a floating state, the potential of the first power supply line ANODE is raised to be a higher potential. If the switch element Tr5 is not accurately turned off and one electrode of the capacitor Cs is not in a floating state, a voltage cannot be held in the capacitor Cs when the potential of the first power supply line ANODE is raised, which is the same as Embodiment Mode 1.

In this embodiment mode, advantages are described below in the case where the display device of the invention is driven by alternating a potential of the first power supply line ANODE. First, power consumption in driving can be reduced because the second power supply line CATHODE connected to large capacitance is not changed. In addition, it is easy to process to drive each scan line independently because the first power supply line ANODE can be formed on a substrate side. That is, a drive with a high duty ratio can be realized without adding a step such as mask deposition in manufacturing.

Embodiment Mode 4

Figure 12A:
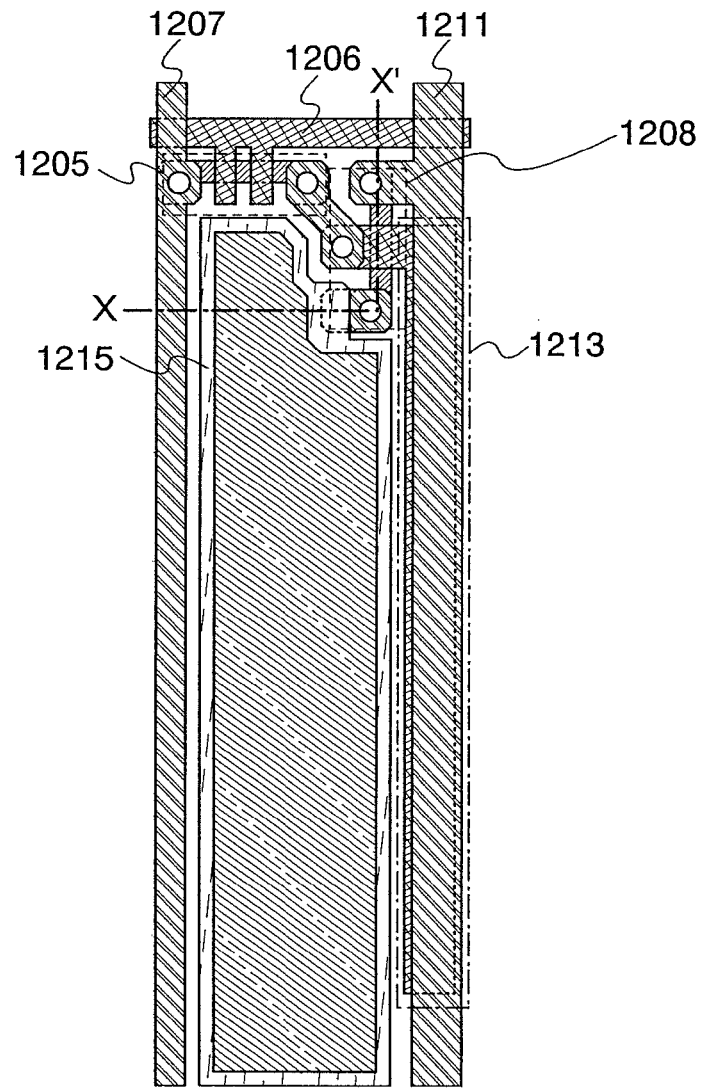
FIGS. 12A and 12B are diagrams each showing a pixel of the invention.
Figure 12B:
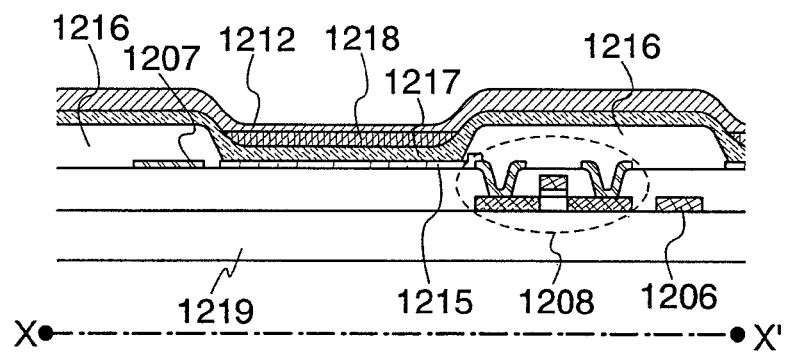

FIG. 12A shows a layout example of an element in a pixel including two TFTs per one pixel. FIG. 12B shows a cross sectional view taken along a line X-X' shown in FIG. 12A.

A pixel of the invention as shown in FIG. 12A may include a first TFT 1205, a first wire 1206, a second wire 1207, a second TFT 1208, a third wire 1211, an opposite electrode 1212, a capacitor 1213, a pixel electrode 1215, a partition wall 1216, an organic conductive film 1217, an organic thin film 1218, and a substrate 1219. Note that it is preferable that the first TFT 1205 functions as a switching TFT, the first wire 1206 functions as a gate signal line, the second wire 1207 functions as a source signal line, the second TFT 1208 functions as a driving TFT, and the third wire 1211 functions as a power supply line.

As shown in FIG. 12A, it is preferable that a gate electrode of the first TFT 1205 is electrically connected to the first wire 1206, one of source and drain electrodes of the first TFT 1205 is electrically connected to the second wire 1207, and the other of the source and drain electrodes thereof is electrically connected to a gate electrode of the second TFT 1208 and one electrode of the capacitor 1213. Note that the gate electrode of the first TFT 1205 may include a plurality of gate electrodes as shown in FIG. 12A. As a result, a leakage current in an off state of the first TFT 1205 can be reduced.

In addition, it is preferable that one of source and drain electrodes of the second TFT 1208 is electrically connected to the third wire 1211, and the other of the source and drain electrodes of the second TFT 1208 is electrically connected to the pixel electrode 1215. As a result, a current flowing to the pixel electrode 1215 can be controlled by the second TFT 1208.

The organic conductive film 1217 may be formed over the pixel electrode 1215, over which the organic thin film (organic compound layer) 1218 may be formed. The opposite electrode 1212 may be formed over the organic thin film (organic compound layer) 1218. Note that the opposite electrode 1212 may be formed so as to be connected to all pixels in common and may be patterned using a shadow mask or the like.

Light from the organic thin film (organic compound layer) 1218 is transmitted through one of the pixel electrode 1215 and the opposite electrode 1212 to be emitted. At this time, in FIG. 12B, in the case where light is emitted to the pixel electrode side, namely a side where a TFT and the like are formed, the pixel electrode 1215 is preferably formed of a light transmissive conductive film. In the case where light is emitted to the opposite electrode side, the opposite electrode 1212 is preferably formed of a light transmissive conductive film.

In addition, as a light emitting device for color display, an EL element which has each light emission color of R, G or B may be separately deposited, or light emission of RGB may be obtained through a color filter.

Note that the structures shown in FIGS. 12A and 12B are only examples, and a pixel layout, a cross sectional structure, a stacking order of electrodes of an EL element, and the like may have various structures other than those shown in FIGS. 12A and 12B. As for a light emitting layer, various elements such as a crystalline element, for example an LED, or an element including an inorganic thin film may be employed other than an element including an organic thin film shown in the drawings.

Figure 13A:
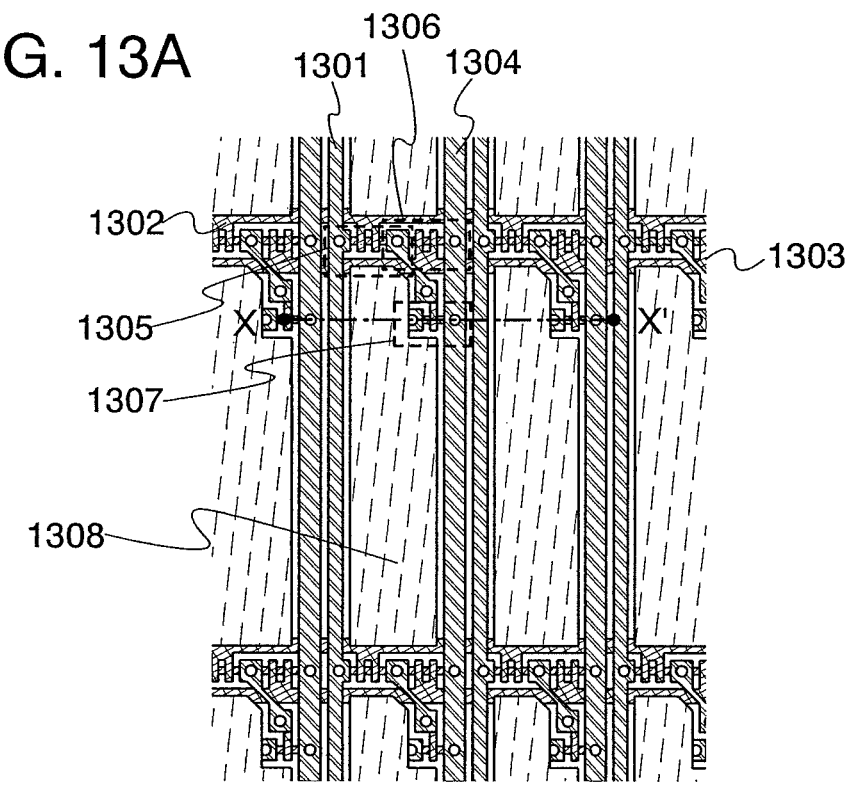
FIGS. 13A and 13B are diagrams each showing a pixel of the invention.
Figure 13B:
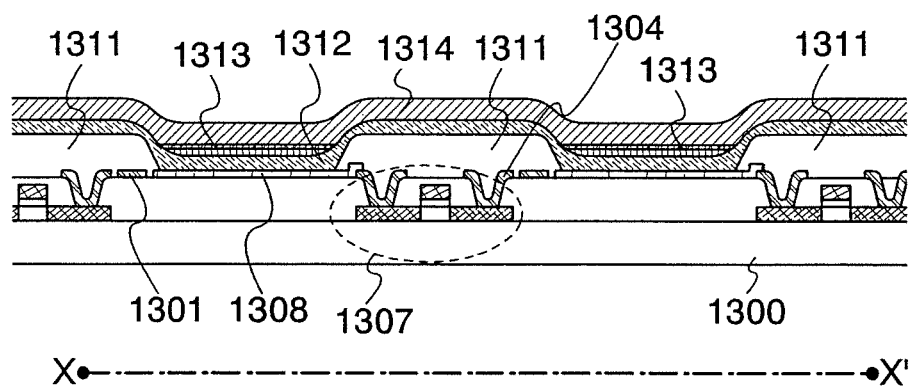

Next, description is made of a layout example of an element in a pixel including three TFTs with reference to FIG. 13A. FIG. 13B shows a cross sectional view taken along a line X-X' shown in FIG. 13A.

As shown in FIG. 13A, a pixel of the invention may include a substrate 1300, a first wire 1301, a second wire 1302, a third wire 1303, a fourth wire 1304, a first TFT 1305, a second TFT 1306, a third TFT 1307, a pixel electrode 1308, a partition wall 1311, an organic conductive film 1312, an organic thin film 1313, and an opposite electrode 1314. Note that it is preferable that the first wire 1301 functions as a source signal line, the second wire 1302 functions as a writing gate signal line, the third wire 1303 functions as an erasing gate signal line, the fourth wire 1304 functions as a power supply line, the first TFT 1305 functions as a switching TFT, the second TFT 1306 functions as an erasing TFT, and the third TFT 1307 functions as a driving TFT.

As shown in FIG. 13A, it is preferable that a gate electrode of the first TFT 1305 is electrically connected to the second wire 1302, one of source and drain electrodes of the first TFT 1305 is electrically connected to the first wire 1301, and the other of the source and drain electrodes thereof is electrically connected to a gate electrode of the third TFT 1307. Note that the gate electrode of the first TFT 1305 may include a plurality of gate electrodes as shown in FIG. 13A, which can reduce a leakage current in an off state of the first TFT 1305.

In addition, it is preferable that a gate electrode of the second TFT 1306 is electrically connected to the third wire 1303, one of source and drain electrodes of the second TFT 1306 is electrically connected to the fourth wire 1304, and the other of the source and drain electrodes thereof is electrically connected to a gate electrode of the third TFT 1307. Note that the gate electrode of the second TFT 1306 may include a plurality of gate electrodes as shown in FIG. 13A, which can reduce a leakage current in an off state of the second TFT 1306.

In addition, it is preferable that one of source and drain electrodes of the third TFT 1307 is electrically connected to the fourth wire 1304 and the other of the source and drain electrodes thereof is electrically connected to the pixel electrode 1308, which can control a current flowing to the pixel electrode 1308 by the third TFT 1307.

The organic conductive film 1312 may be formed over the pixel electrode 1308, over which the organic thin film (organic compound layer) 1313 may be formed. The opposite electrode 1314 may be formed over the organic thin film (organic compound layer) 1313. Note that the opposite electrode 1314 may be formed so as to be connected to all pixels in common, and may be patterned using a shadow mask or the like.

Light from the organic thin film (organic compound layer) 1313 is transmitted through one of the pixel electrode 1308 and the opposite electrode 1314 to be emitted. At this time, in FIG. 13B, in the case where a light is emitted to the pixel electrode side, namely a side of which a TFT and the like are formed, the pixel electrode 1308 is preferably formed of a light transmissive conductive film. In the case where light is emitted to the opposite electrode side, the opposite electrode 1314 is preferably formed of a light transmissive conductive film.

In addition, as a light emitting apparatus for color display, an EL element which has each light emission color of R, G or B may be separately deposited, or light emission of RGB may be obtained through a color filter.

Note that the structures shown in FIGS. 13A and 13B are examples, and a pixel layout, a cross sectional structure, a stacking order of electrodes of an EL element, and the like may have various structures other than shown in FIGS. 13A and 13B. As for a light emitting layer, various elements such as a crystalline element, for example an LED, an element including an inorganic thin film may be employed other than an element including an organic thin film shown in the drawings.

Figure 14A:
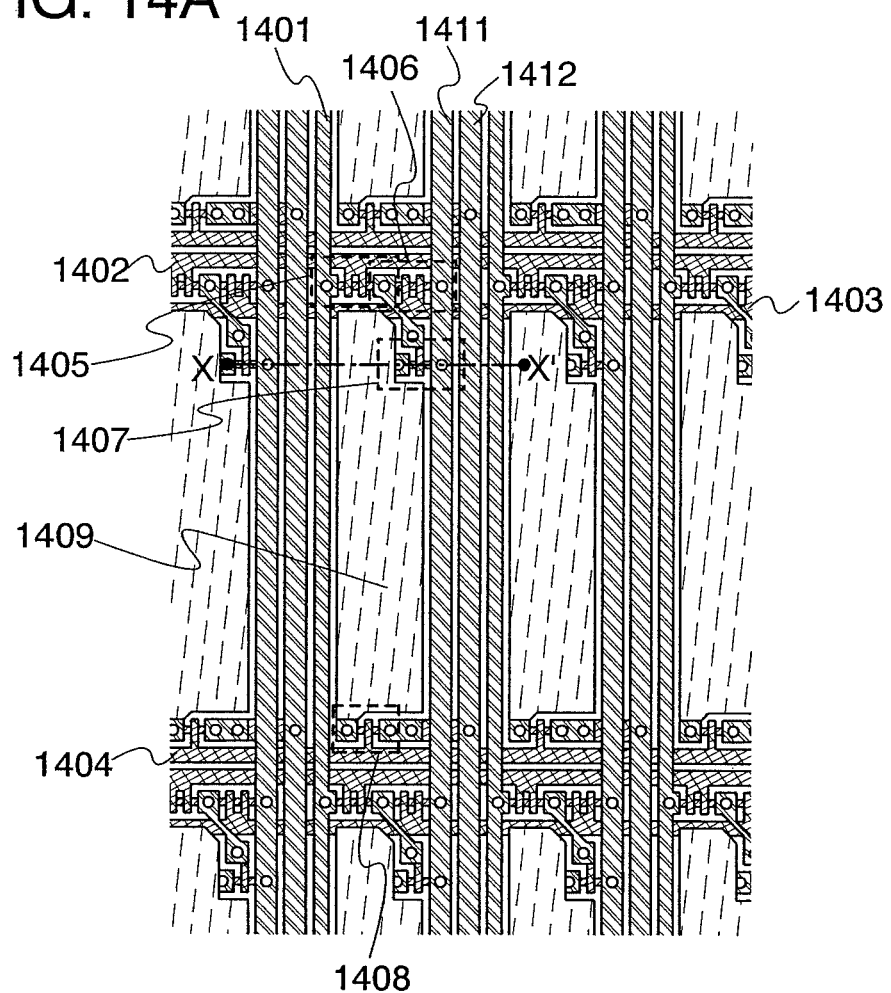
FIGS. 14A and 14B are diagrams each showing a pixel of the invention.
Figure 14B:
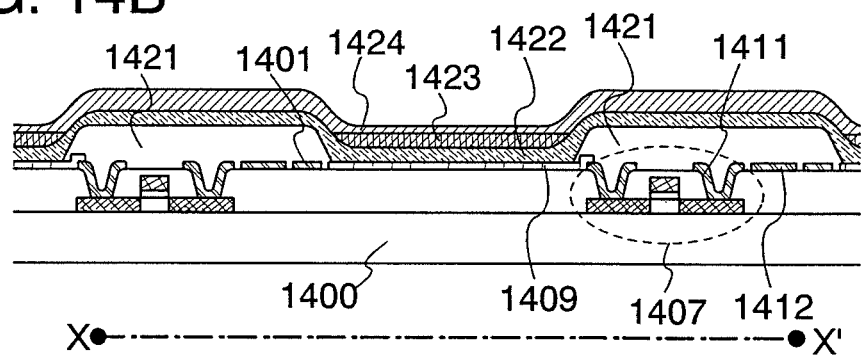

Next, description is made of a layout example of an element in a pixel including four TFTs per one pixel with reference to FIG. 14A. FIG. 14B shows a cross sectional view taken along a line X-X' shown in FIG. 14A.

As shown in FIG. 14A, a pixel of the invention may include a substrate 1400, a first wire 1401, a second wire 1402, a third wire 1403, a fourth wire 1404, a first TFT 1405, a second TFT 1406, a third TFT 1407, a fourth TFT 1408, a pixel electrode 1409, a fifth wire 1411, a sixth wire 1412, a partition wall 1421, an organic conductive film 1422, an organic thin film 1423, and an opposite electrode 1424. Note that it is preferable that the first wire 1401 functions as a source signal line, the second wire 1402 functions as a writing gate signal line, the third wire 1403 functions as an erasing gate signal line, the fourth wire 1404 functions as a reverse bias supplying signal line, the first TFT 1405 functions as a switching TFT, the second TFT 1406 functions as an erasing TFT, the third TFT 1407 functions as a driving TFT, the fourth TFT 1408 functions as a reverse bias supplying TFT, the fifth wire 1411 functions as a power supply line, and the sixth wire 1412 functions as a reverse bias power supply line.

As shown in FIG. 14A, it is preferable that a gate electrode of the first TFT 1405 is electrically connected to the second wire 1402, one of source and drain electrodes of the first TFT 1405 is electrically connected to the first wire 1401, and the other of the source and drain electrodes thereof is electrically connected to a gate electrode of the third TFT 1407. Note that the gate electrode of the first TFT 1405 may include a plurality of gate electrodes as shown in FIG. 14A, which can reduce a leakage current in an off state of the first TFT 1405.

In addition, it is preferable that a gate electrode of the second TFT 1406 is electrically connected to the third wire 1403, one of source and drain electrodes of the second TFT 1406 is electrically connected to the fifth wire 1411, and the other of the source and drain electrodes thereof is electrically connected to a gate electrode of the third TFT 1407. Note that the gate electrode of the second TFT 1406 may include a plurality of gate electrodes as shown in FIG. 14A, which can reduce a leakage current in an off state of the second TFT 1406.

In addition, it is preferable that one of source and drain electrode of the third TFT 1406 is electrically connected to the fifth wire 1411, and the other of the source and drain electrodes thereof is electrically connected to the pixel electrode 1409, which can control a current flowing to the pixel electrode 1409 by the third TFT 1407.

In addition, it is preferable that a gate electrode of the fourth TFT 1408 is electrically connected to the fourth wire 1404, one of source and drain electrodes of the fourth TFT 1408 is electrically connected to the sixth wire 1412, the other of the source and drain electrodes thereof is electrically connected to the pixel electrode 1409. As a result, a potential of the pixel electrode 1409 can be controlled by the fourth TFT 1408; therefore, a reverse bias voltage can be applied to the organic conductive film 1422 and the organic thin film 1423. The reverse bias voltage is applied to a light emitting element including the organic conductive film 1422, the organic thin film 1423 and the like, which may significantly improve reliability of the light emitting element.

It is known that, for example, in the case where a light emitting element of which half decay time of luminance is about 400 hours when driven with a DC voltage (3.65 V) is driven with an AC voltage (forward bias: 3.7 V, reverse bias: 1.7 V, duty ratio: 50%, and AC frequency: 60 Hz), the half decay time of luminance thereof is known to be 700 hours or more.

The organic conductive film 1422 may be formed over the pixel electrode 1409, over which the organic thin film (organic compound layer) 1423 may be formed. The opposite electrode 1424 may be formed over the organic thin film (organic compound layer) 1423. Note that the opposite electrode 1424 may be formed so as to be connected to all pixels in common, and may be patterned using a shadow mask or the like.

Light from the organic thin film (organic compound layer) 1423 is transmitted through one of the pixel electrode 1409 and the opposite electrode 1424 and emitted. At this time, in FIG. 14B, in the case where a light is emitted to the pixel electrode side, namely a side of which a TFT and the like are formed, the pixel electrode 1409 is preferably formed by a light transmissive conductive film. In the case where a light is emitted to the opposite electrode side, the opposite electrode 1424 is preferably formed by a light transmissive conductive film.

In addition, as a light emitting apparatus for color display, an EL element which has each light emission color of R, G or B may be separately deposited, or light emission of RGB may be obtained through a color filter.

Note that the structures shown in FIGS. 14A and 14B are examples, and a pixel layout, a cross sectional structure, a stacking order of electrodes of an EL element, and the like may have various structures other than shown in FIGS. 14A and 14B. As for a light emitting layer, various elements such as a crystalline element, for example an LED, an element including an inorganic thin film may be employed other than an element including an organic thin film shown in the drawings.

Next, description is made of a structure of an EL element which can be applied to the invention.

The EL element which can be applied to the invention instead of may have a structure (hereinafter called a mixed junction type EL element) including a layer (mixed layer) which are compounded of a plurality of materials selected from a hole injecting material, hole transporting material, light emitting material, electron transporting material, and electron injecting material are mixed, a stacked-layer structure where a hole injecting layer formed of a hole injecting material, a hole transporting layer formed of a hole transporting material, a light emitting layer formed of a light emitting material, an electron transporting layer formed of an electron transporting material, an electron injecting layer formed of an electron injecting material and the like which are clearly distinct.

FIGS. 15A to 15E show schematic views of structures of a mixed junction type EL element. In FIGS. 15A to 15E, reference numeral 1501 denotes an anode of the EL element and 1502 denotes a cathode of the EL element. A layer sandwiched between the anode 1501 and the cathode 1502 corresponds to an EL layer.

In FIG. 15A, the EL layer may include a hole transporting region 1503 formed of a hole transporting material and an electron transporting region 1504 formed of an electron transporting material, where the hole transporting region 1503 is closer to an anode side than the electron transporting region 1504, and a mixed region 1505 including both the hole transporting material and the electron transporting material is provided between the hole transporting region 1503 and the electron transporting region 1504.

Note that at that time it may be characterized in that concentration of the hole transporting material in the mixed region 1505 decreases in a direction from the anode 1501 to the cathode 1502, while concentration of the electron transporting material in the mixed region 1505 increases.

Note that in the above structure, the hole transporting region 1503 consisted only of the hole transporting material may not exist, and a ratio of concentration of each functional material changes in the mixed region 1505 including both the hole transporting material and the electron transporting material (that is, a structure having a concentration gradient). It may also have a structure where the hole transporting region 1503 consisted only of the hole transporting material and the electron transporting region consisted only of the electron transporting material do not exist, and a ratio of concentration of each functional material changes in the mixed region 1505 including both the hole transporting material and the electron transporting material (that is, a structure having a concentration gradient). The ratio of concentration may be changed in accordance with a distance from the anode or the cathode. In addition, the ratio of concentration may change continuously. The concentration gradient may be set freely.

A region 1506 to which a light emitting material is added is provided in the mixed region 1505. A light emission color of the EL element can be controlled by a light emitting material. In addition, a carrier can be trapped by the light emitting material. As for the light emitting material, a metal complex including a quinoline skeleton, a metal complex including a benzoxazol skeleton, a metal complex including a benzothiazole skeleton, and the like may be employed as well as various fluorescent dyes. The light emission color of the EL element can be controlled by adding these light emitting materials.

As for the anode 1501, an electrode material with high work function is preferably employed so as to inject a hole effectively. For example, a light transmissive electrode such as tin-doped indium oxide (ITO), zinc-doped indium oxide (IZO), ZnO, $SnO_2$, and $In_2O_3$ may be employed. If a transparency is not required, the anode 1501 may be formed of an opaque metal material.

As for the hole transporting material, a compound of an aromatic amine group and the like may be employed.

As for the electron transporting material, a quinoline derivative, a metal complex including 8-quinolinol or a derivative thereof as a ligand (especially tris(8-quinolinolato) aluminum) and the like may be employed.

As for the cathode 1502, an electrode material with a low work function is preferably employed so as to inject an electron effectively. A metal such as aluminum, indium, magnesium, silver, calcium, barium, and lithium may be employed as a single material. In addition, an alloy thereof may be employed as well as an alloy of the aforementioned metal and other metal.

FIG. 15B shows a schematic view of a structure of an EL element other than that shown in FIG. 15A. Note that the same portions as those in FIG. 15A are described by the same reference numerals, and description thereof is omitted here.

In FIG. 15B, a region to which a light emitting material is added is not included. However, as for a material added to the electron transporting region 1504, a material (electron-transporting light-emitting material) including both an electron transporting property and a light emitting property, for example, tris(8-quinolinolato)aluminum may be employed, which can perform light emission.

Alternatively, as for a material added to the hole transporting region 1503, a material (hole-transporting light-emitting material) including both a hole transporting property and a light emitting property may be employed.

FIG. 15C shows a schematic view of a structure of an EL element which is different from those in FIGS. 15A and 15B. Note that the same portions as those in FIGS. 15A and 15B are described by the same reference numerals, and description thereof is omitted here.

FIG. 15C includes a region 1507 including the mixed region 1505 to which a hole blocking material is added, of which energy difference between a highest occupied molecular orbital and lowest occupied molecular orbital is wider than that of a hole transporting material. The region 1507 to which the hole blocking material is added is placed on the cathode 1502 side than the region 1506 to which the light emitting material is added in the mixed region 1505, thereby, a recombination rate of a carrier and light emission efficiency can be increased. A structure provided with the region 1507 to which the hole blocking material is added as described above is especially effective in an EL element which utilizes light emission (phosphorescence) by a triplet exciton.

FIG. 15D shows a schematic view of a structure of an EL element which is different from those in FIGS. 15A, 15B and 15C. Note that the same portions as those in FIGS. 15A to 15C are described by the same reference numerals, and description thereof is omitted here.

FIG. 15D includes a region 1508 including the mixed region 1505 to which an electron blocking material is added, of which energy difference between a highest occupied molecular orbital and a lowest occupied molecular orbital is wider than that of an electron transporting material. The region 1508 to which the electron blocking material is added is placed on the anode 1501 side than the region 1506 to which the light emitting material is added in the mixed region 1505, thereby, a recombination rate of a carrier and light emission efficiency can be increased. A structure provided with the region 1508 to which the electron blocking material is added as described above is especially effective in an EL element which utilizes light emission (phosphorescence) by a triplet exciton.

FIG. 15E shows a schematic view of a structure of an a different mixed junction type EL element from those in FIGS. 15A to 15D. FIG. 15E shows an example of a structure including a region 1509 to which a metal material is added in a part of an EL layer contacted with an electrode of an EL element. In FIG. 15E, the same portions as those in FIGS. 15A to 15D are described by the same reference numerals, and description thereof is omitted. A structure shown in FIG. 15E may, for example, employ MgAg (Mg—Ag alloy) as the cathode 1502 and may include the region 1509 to which Al (aluminum) alloy is added in a region contacted with the cathode 1502 of the region 1504 to which an electron transporting material is added. By the aforementioned structure, oxidation of the cathode may be prevented, and injection efficiency of an electron from the cathode may be increased. Therefore, the lifetime of the mixing junction type EL element may be longer, and a driving voltage may be lowered.

A method of manufacturing the mixed junction type EL element described above may be co-vapor deposition and the like.

The mixed junction type EL element such as those shown in FIGS. 15A to 15E does not have a clear interface between the layers, and charge accumulation can be reduced. In this manner, the lifetime of the EL element can be extended, and a driving voltage can be lowered.

Note that the structures shown in FIGS. 15A to 15E may be freely implemented in combination with each other.

Note that a structure of the mixed junction type EL element is not limited to those described above. A known structure may be freely employed.

Note that an organic material which forms an EL layer of an EL element may be a low molecular material, high molecular material, or both of them. In the case where a low molecular material is employed as an organic compound material, a film can be formed by vapor deposition. On the other hand, in the case where a high molecular material is employed as the EL layer, the high molecular material is dissolved in a solvent and a film may be formed by a spin coating method or an ink-jet method.

In addition, the EL layer may be formed of a medium molecular material. In this specification, a medium molecular organic light emitting material denotes an organic light emitting material without a sublimation property and with a polymerization degree of about 20 degrees or lower. In the case where a medium molecular material is employed as the EL layer, a film can be formed by an ink-jet method and the like.

Note that a low molecular material, a high molecular material and a medium molecular material may be used in combination.

In addition, an EL element may utilize light emission (fluorescence) of a singlet exciton or light emission (phosphorescence) of a triplet exciton.

Next, a vapor deposition apparatus for manufacturing a display device to which the invention can be applied is described with reference to the drawings.

The display device to which the invention can be applied may be manufactured by forming an EL layer. The EL layer is formed including a material which produces electroluminescence in at least a part thereof. The EL layer may be formed of a plurality of layers having different functions. In this case, the EL layer may be formed of a combination of layers having different functions, which are called a hole injecting transporting layer, light emitting layer, electron injecting transporting layer, and the like.

Figure 16:
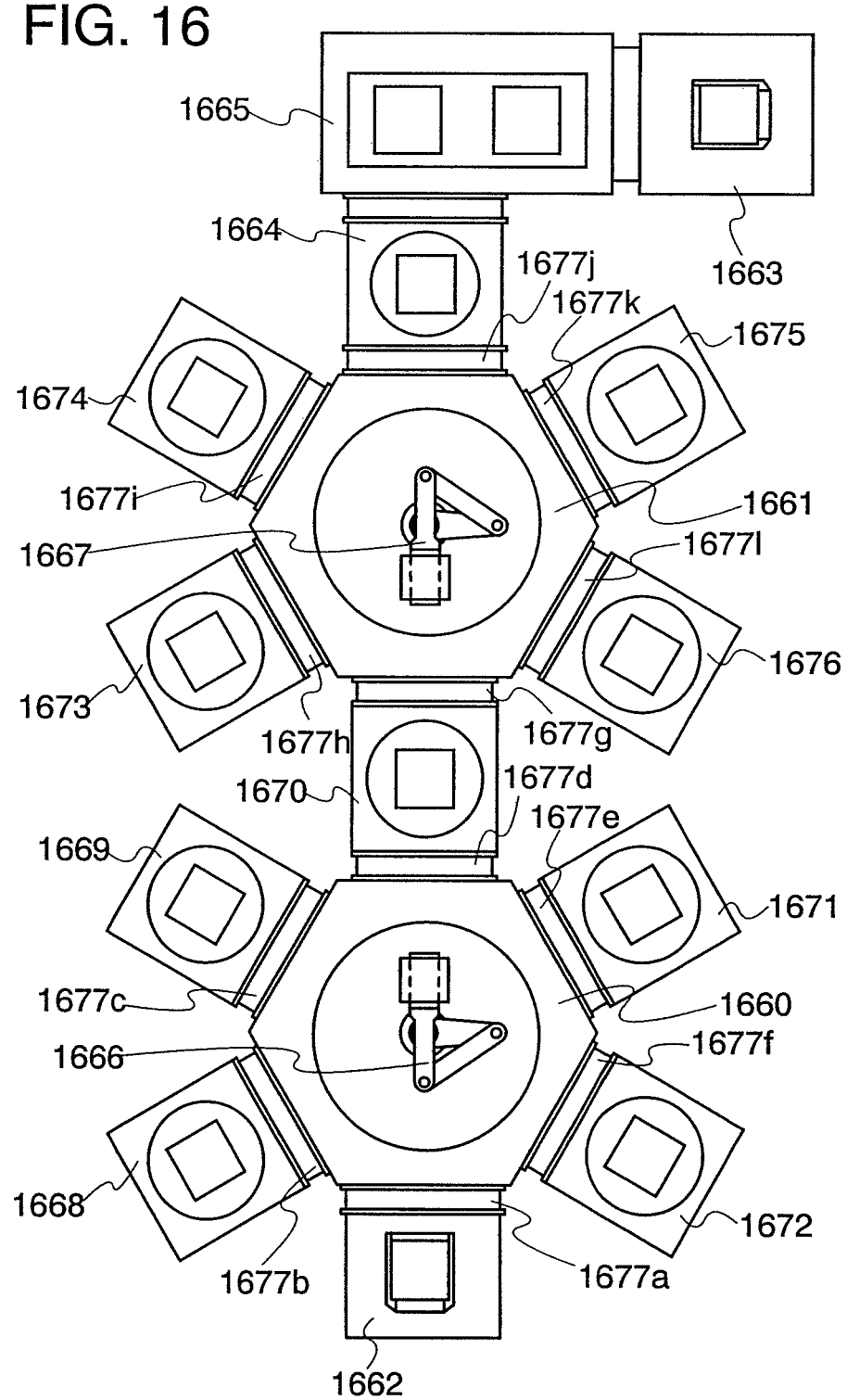
FIG. 16 is a diagram showing a vapor deposition apparatus for manufacturing a display element of the invention.

FIG. 16 shows a structure of a vapor deposition apparatus for forming an EL layer over an element substrate over which a transistor is formed. In the vapor deposition apparatus, transfer chambers 1660 and 1661 are connected to a plurality of treatment chambers. Each treatment chamber includes a loading chamber 1662 for supplying a substrate, an unloading chamber 1663 for collecting the substrate, a heat treatment chamber 1668, a plasma treatment chamber 1672, deposition treatment chambers 1669 to 1671, 1673 to 1675 for depositing an EL material, and a deposition treatment chamber 1676 for forming a conductive film formed of aluminum or using aluminum as a main component as one electrode of an EL element. In addition, gate valves 1677a to 1677l are provided between the transfer chambers and each treatment chamber, thereby the pressure in each treatment chamber can be controlled independently, and cross contamination between the treatment chambers is prevented.

A substrate introduced to the transfer chamber 1660 from the loading chamber 1662 is transferred to a predetermined treatment chamber by an arm type transfer unit 1666 rotatably. In addition, the substrate is transferred from a certain treatment chamber to another treatment chamber by the transfer unit 1666. The transfer chambers 1660 and 1661 are connected by the deposition treatment chamber 1670, where the substrate is delivered and received by the transfer unit 1666 and a transfer unit 1667.

Each treatment chamber connected to the transfer chambers 1660 and 1661 is held under a reduced pressure. Therefore, in the vapor deposition apparatus, a film forming process of the substrate is continuously performed without a direct contact with a room air. A display panel which is completed to form an EL layer may be deteriorated due to moisture or the like; therefore, in this vapor deposition apparatus, a sealing treatment chamber 1665, which performs a sealing treatment to maintain a quality before exposure to the air, is connected to the transfer chamber 1661. As the sealing treatment chamber 1665 is under atmospheric pressure or reduced pressure similar thereto, an intermediate chamber 1664 is also provided between the transfer chamber 1661 and the sealing treatment chamber 1665. The intermediate chamber 1664 is provided for delivering and receiving the substrate and buffering the pressure in the chamber.

An exhaust unit is provided in the loading chamber, the unloading chamber, and the deposition treatment chamber in order to hold a reduced pressure in the chamber. As for the exhaust unit, various vacuum pumps such as a dry pump, a turbo-molecular pump, and a diffusion pump may be employed.

In the vapor deposition apparatus of FIG. 16, the number of treatment chambers connected to the transfer chambers 1660 and 1661 and structure thereof may be combined with each other in accordance with a stacked-layer structure of the EL element appropriately. An example of the combination is described below.

The heat treatment chamber 1668 performs degasification by heating a substrate over which a lower electrode, and an insulating partition wall, and the like are primarily formed. In the plasma treatment chamber 1672, a surface of the lower electrode is treated with an inert gas or oxygen plasma. The plasma treatment is performed for cleaning the surface, stabilizing a surface state, and stabilizing a physical or chemical state (for example, a work function or the like) of the surface.

The deposition treatment chamber 1669 is a treatment chamber for forming an electrode buffer layer connected to one electrode of the EL element. The electrode buffer layer has a carrier injection property (hole injection or electron injection) and controls generation of a short-circuit or a black spot defect of the EL element. Typically, the electrode buffer layer is formed of an organic inorganic hybrid material, of which resistivity is $5 \times 10^4$ to $1 \times 10^6$ $\Omega$cm, to have a thickness of 30 to 300 nm. In addition, a deposition treatment chamber 1671 is a treatment chamber for forming a hole transporting layer.

A light-emitting layer in an EL element has a different structure between the case of emitting monochromatic light and the case of emitting white light. A deposition treatment chamber is preferably provided in the vapor deposition apparatus in accordance therewith. For example, in the case of forming three kinds of EL elements having a different light emission color in a display panel, it is required to form a light emitting layer corresponding to each light emission color. In this case, the deposition treatment chamber 1670 can be used for forming a first light emitting layer, a deposition treatment chamber 1673 can be used for forming a second light emitting layer, and a deposition treatment chamber 1674 may be used for forming a third light emitting layer. By separating the deposition treatment chambers for each light emitting layer, cross contamination due to different light emitting materials can be prevented, and throughput of the deposition treatment can be improved.

In addition, three kinds of EL elements having different light emission colors may be sequentially deposited in each of the deposition treatment chambers 1670, 1673 and 1674. In this case, deposition is performed by moving a shadow mask in accordance with a region to be deposited.

In the case of forming an EL element which emits white light, the EL element is formed by stacking light emitting layers of different light emission colors vertically. In this case, the element substrate may be transferred through the deposition treatment chambers sequentially so as to form a film for each light emitting layer. Further, different light emitting layers can be formed continuously in the same deposition treatment chamber.

In the deposition treatment chamber 1676, an electrode is formed over an EL layer. The electrode can be formed by electron beam vapor deposition or a sputtering method; however, resistance heating vapor deposition is preferably employed.

An element substrate over which up to the electrode is formed is transferred to the sealing treatment chamber 1665 through the intermediate chamber 1664. The sealing treatment chamber 1665 is filled with an inert gas such as helium, argon, neon, or nitrogen, and a sealing substrate is attached and sealed to a side where an EL layer of an element substrate is formed under the atmosphere. In a sealed state, a space between the element substrate and the sealing substrate may be filled with the inert gas or a resin material. The sealing treatment chamber 1665 is provided with a dispenser which draws a sealant, a mechanical element such as an arm and a fixing stage which fixes the sealing substrate to face the element substrate, a dispenser or a spin coater which fills the chamber with a resin material.

Figure 17:
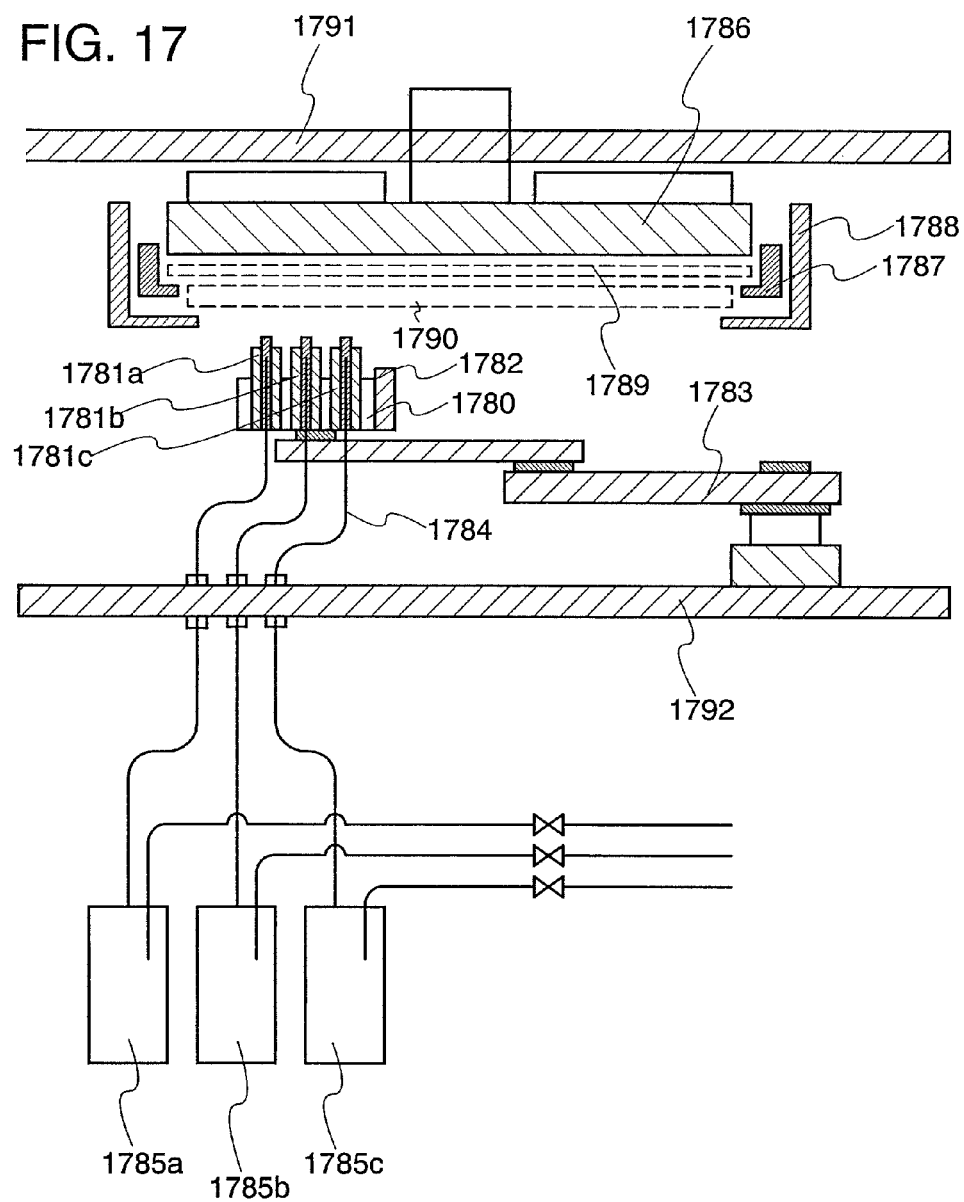
FIG. 17 is a diagram showing a deposition process chamber of a vapor deposition apparatus of the invention.

FIG. 17 shows an internal structure of a deposition treatment chamber. A reduced pressure is held in the deposition treatment chamber. In FIG. 17, an inner side sandwiched between a top plate 1791 and a bottom plate 1792 is an inner chamber, which is held under reduced pressure.

One or a plurality of evaporation sources are provided in the treatment chamber. This is because it is preferable to provide a plurality of evaporation sources in the case of forming a plurality of layers having different compositions or in the case of co-evaporating different materials. In FIG. 17, evaporation sources 1781a, 1781b, and 1781c are mounted in an evaporation source holder 1780. The evaporation source holder 1780 is held by a multijoint arm 1783. The multijoint arm 1783 may freely move the evaporation source holder 1780 within a range of movement thereof by stretching the joint. In addition, the evaporation source holder 1780 may be provided with a distance sensor 1782 to monitor a distance between the evaporation sources 1781a to 1781c and a substrate 1789, so that an optimum distance for deposition may be controlled. In this case, a multijoint arm which is also displaced toward an upper and lower direction (Z direction) may be employed as the multijoint arm 1783.

The substrate 1789 is fixed by a substrate stage 1786 and a substrate chuck 1787 together. The substrate stage 1786 may have a structure in which a heater is incorporated so that the substrate 1789 can be heated. The substrate 1789 is fixed to the substrate stage 1786 and carried in and out by tightening and loosening the substrate chuck 1787. At the time of deposition, a shadow mask 1790 which includes an opening corresponding to a deposition pattern may be employed as required. In this case, the shadow mask 1790 is provided between the substrate 1789 and the evaporation sources 1781a to 1781c. The shadow mask 1790 is fixed to the substrate 1789 in a close contact or with a certain interval by a mask chuck 1788. When an alignment of the shadow mask 1790 is required, the alignment is performed by arranging a camera in a treatment chamber and providing the mask chuck 1788 with a positioning unit which moves slightly in an X-Y-θ direction.

The evaporation sources 1781a to 1781c include an evaporation material supply unit, which continuously supplies an evaporation material to the evaporation sources. The evaporation material supply unit includes evaporation material supply sources 1785a, 1785b, and 1785c, which are arranged apart from the evaporation sources 1781a to 1781c, and a material supply pipe 1784 which connects therebetween. Typically, the material supply sources 1785a to 1785c are provided corresponding to the evaporation sources 1781a to 1781c. In FIG. 17, the material supply source 1785a corresponds to the evaporation source 1781a. The same is applied to the material supply source 1785b and the evaporation source 1781b, and the material supply source 1785c and the evaporation source 1781c.

As a method for supplying an evaporation material, an airflow transfer method, an aerosol method, and the like may be applied. By an airflow transfer method, impalpable powder of an evaporation material is transferred in airflow, for which an inert gas or the like is used to transfer to the evaporation sources 1781a to 1781c. By an aerosol method, vapor deposition is performed by transferring material liquid in which an evaporation material is dissolved or resolved in a solvent, which is aerosolized by an atomizer, and the solvent in the aerosol is evaporated. In each case, the evaporation sources 1781a to 1781c are provided with a heating unit, and form a film over the substrate 1789 by evaporating the evaporation material transferred thereto. In FIG. 17, the material supply pipe 1784 can be bent flexibly and is formed of a thin pipe which has enough rigidity not to be transformed even under a reduced pressure.

In the case of applying the airflow transfer method and aerosol method, vapor deposition may be performed under atmospheric pressure or lower pressure in the deposition treatment chamber, and preferably performed under a reduced pressure of 133 to 13300 Pa. The pressure in the deposition treatment chamber may be adjusted by filling an inert gas such as helium, argon, neon, krypton, xenon, or nitrogen in the deposition treatment chamber, or supplying the gas (and simultaneously exhausting the gas). In addition, an oxidizing atmosphere may be formed by introducing a gas such as oxygen or nitrous oxide in the deposition treatment chamber where an oxide film is formed. Further, a reducing atmosphere may be formed by introducing a gas such as hydrogen in the deposition treatment chamber where an organic material is deposited.

As for another method for supplying an evaporation material, such a structure may be employed, in which an evaporation material is continuously pushed toward the evaporation source by providing a screw in the material supply pipe 1784.

By using the vapor deposition apparatus of FIG. 16, a film can be formed continuously with high uniformity even in the case of a large display panel. In addition, it is not required to supply an evaporation material to the evaporation source every time the evaporation material is run out in the evaporation source; therefore, throughput can be improved.

Note that this embodiment mode can be freely implemented in combination with other embodiment modes.

Embodiment Mode 5

Figure 18:
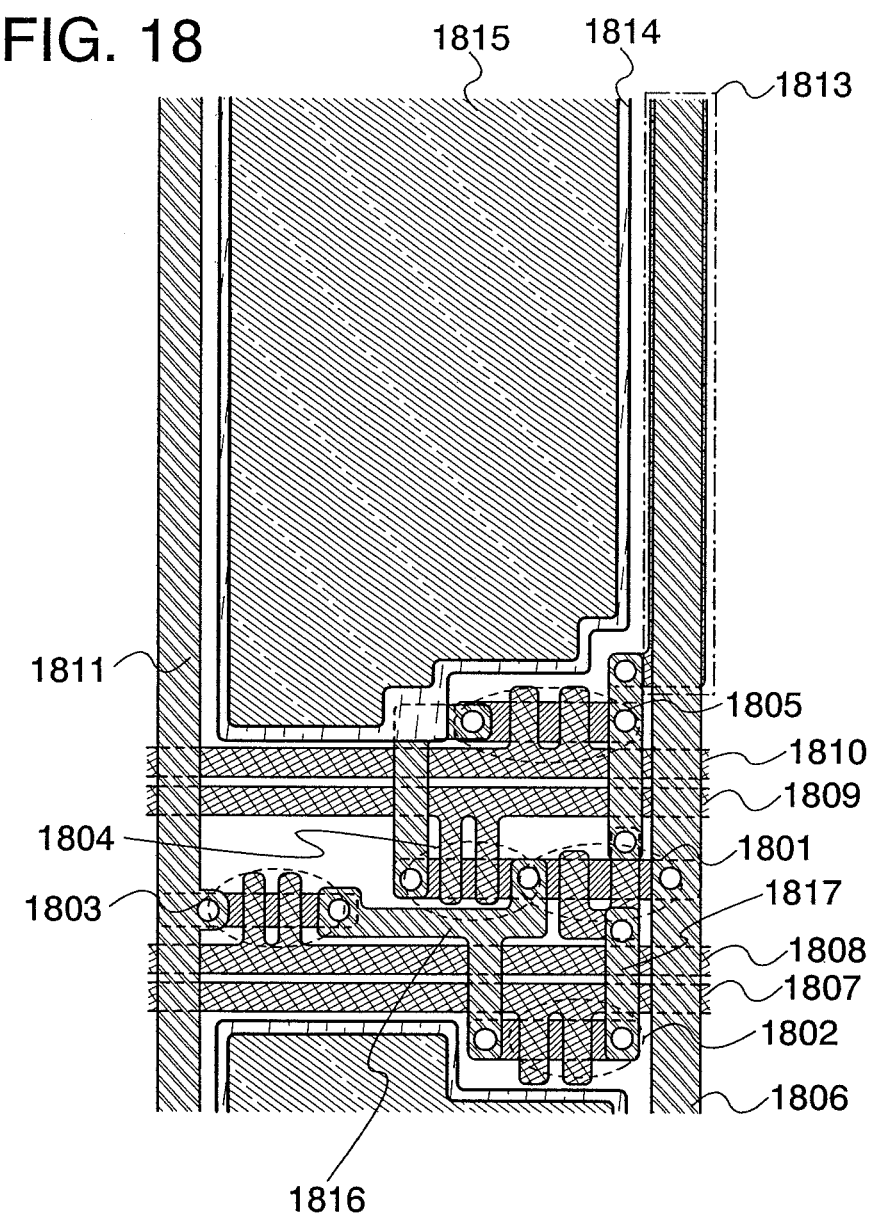
FIG. 18 is a diagram showing a pixel of the invention.

FIG. 18 shows a layout example of a pixel to which the invention can be applied.

As shown in FIG. 18, a pixel of the invention may include a first TFT 1801, a second TFT 1802, a third TFT 1803, a fourth TFT 1804, a fifth TFT 1805, a first wire 1806, a second wire 1807, a third wire 1808, a fourth wire 1809, a fifth wire 1810, a sixth wire 1811, a capacitor 1813, a pixel electrode 1814, a partition wall opening 1815, a light emitting element provided in the partition wall opening 1815, an electrode 1816 and an electrode 1817. Note that the first TFT 1801 is preferably employed as a driving TFT, and the second TFT 1802, the third TFT 1803, the fourth TFT 1804 and the fifth TFT 1805 are preferably employed as switching TFTs. In addition, the first wire 1806 is preferably employed as a power supply line. The second wire 1807, the third wire 1808, the fourth wire 1809 and the fifth wire 1810 are preferably employed as a signal line for turning on or off the second TFT 1802, the third 1803, the fourth TFT 1804 and the fifth 1805. The sixth wire 1811 is preferably employed as a source signal line.

As shown in FIG. 18, a gate electrode of the first TFT 1801 may be electrically connected to the electrode 1817, one of source and drain electrodes of the first TFT 1801 may be electrically connected to the first wire 1806, and the other of the source and drain electrodes of the first TFT 1801 may be electrically connected to the electrode 1816. Note that the first TFT 1801 is preferably formed with a structure having a plurality of channel regions as shown in FIG. 18, which can prevent the light emission of a light emitting element by a current supplied to the light emitting element by a leakage current when the first TFT 1801 is off.

In addition, a gate electrode of the second TFT 1802 may be electrically connected to the second wire 1807, one of source and drain electrodes of the second TFT 1802 may be electrically connected to the electrode 1816, and the other of the source and drain electrodes of the second TFT 1802 may be electrically connected to the electrode 1817. Note that the second TFT 1802 is preferably formed with a structure having a plurality of channel regions as shown in FIG. 18, which can prevent a charge stored in the capacitor 1813 from leaking by an leakage current when the second TFT 1802 is off.

In addition, a gate electrode of the third TFT 1803 may be electrically connected to the third wire 1808, one of source and drain electrodes of the third TFT 1803 may be electrically connected to the sixth wire 1811, and the other of the source and drain electrodes of the third TFT 1803 may be electrically connected to the electrode 1816. Note that the third TFT 1803 is preferably formed with a structure having a plurality of channel regions as shown in FIG. 18, which can prevent a current flowing to the light emitting element from changing by a leakage current when the third TFT 1803 is off.

In addition, a gate electrode of the fourth TFT 1804 may be electrically connected to the fourth wire 1809, one of source and drain electrodes of the fourth TFT 1804 may be electrically connected to the pixel electrode 1814, and the other of the source and drain electrodes of the fourth TFT 1804 may be electrically connected to the electrode 1816. Note that the fourth TFT 1804 is preferably formed with a structure having a plurality of channel regions as shown in FIG. 18, which can prevent the light emission of a light emitting element by a current supplied to the light emitting element by a leakage current when the fourth TFT 1804 is off.

In addition, a gate electrode of the fifth TFT 1805 may be electrically connected to the fifth wire 1810, one of source and drain electrodes of the fifth TFT 1805 may be electrically connected to the pixel electrode 1814, and the other of the source and drain electrodes of the fifth TFT 1805 may be electrically connected to the electrode 1817. Note that the fifth TFT 1805 is preferably formed with a structure having a plurality of channel regions as shown in FIG. 18, which may prevent a charge stored in the capacitor 1813 from leaking by an leakage current when the fifth TFT 1805 is off.

Note that it is preferable that a plurality of TFTs have a structure in which a direction of a current flow is almost the same as that shown in FIG. 18. Here, a direction of a current flow means an angle such as a vertical direction and a horizontal direction, and does not depend on a bias of a current flow. That is, a vertical direction includes both the case that a current flows from right to left and the case that a current flows from left from light. As described above, with a structure in which a direction of current flow is almost the same in a plurality of TFTs, TFT characteristics can be uniform, and luminance variations of the display device can be reduced.

Note that the pixel electrode 1814 may include an organic conductive film, and may further include an organic thin film (organic compound layer). An opposite electrode may be provided in the organic thin film (organic compound layer). In addition, the opposite electrode may be formed so as to be connected to all pixels in common, and may be patterned using a shadow mask or the like.

In addition, as a light emitting device for color display, an EL element which has each light emission color of R, G or B may be separately deposited, or light emission of RGB may be obtained through a color filter.

Note that the structure shown in FIG. 18 is only a example, and a pixel layout, a cross sectional structure, a stacking order of electrodes of an EL element, and the like may have various structures other than that shown in FIG. 18. As for a light emitting layer, various elements such as a crystalline element, for example an LED, or an element including an inorganic thin film may be employed other than an element including an organic thin film shown in the drawings.

Embodiment Mode 6

Figure 10A:
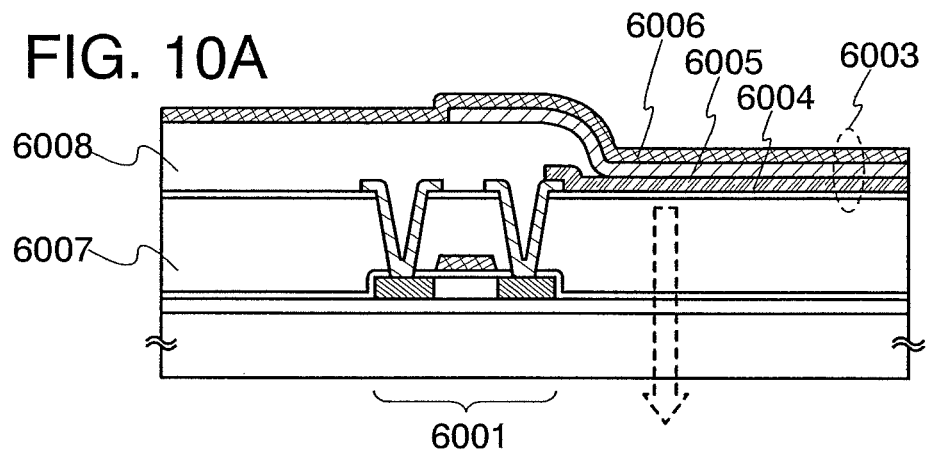
FIGS. 10A to 10C are diagrams each showing a manufacturing step of a display device of the invention.
Figure 10B:
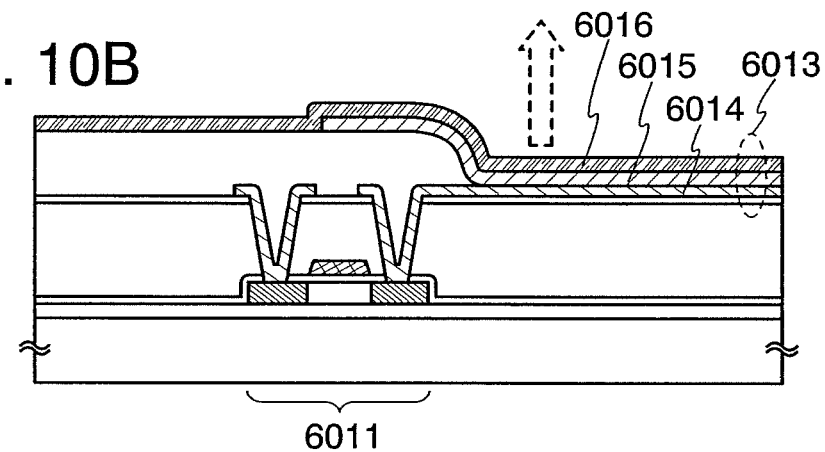
Figure 10C:
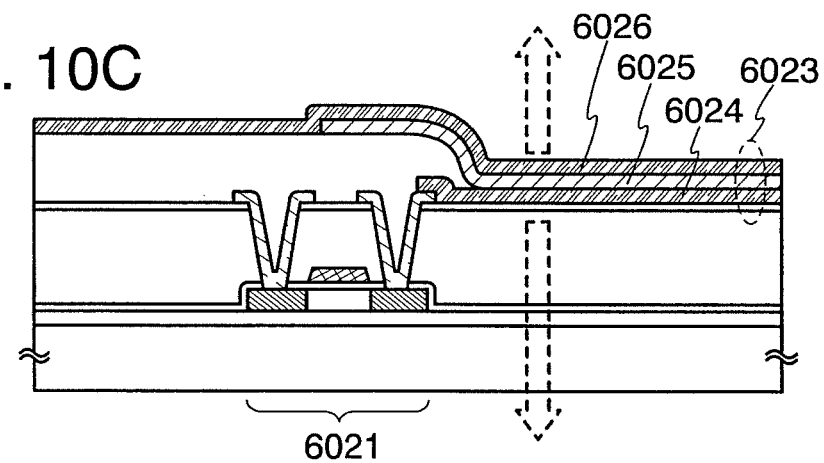

In this embodiment mode, description is made of a cross sectional structure of a pixel circuit in the case where a p-channel type thin film transistor (TFT) is employed as a driving transistor with reference to FIGS. 10A to 10C. Note that in this embodiment mode, one electrode of an EL element is referred to as a first electrode, and the other electrode thereof is referred to as a second electrode.

FIG. 10A shows a cross sectional view of a pixel circuit in the case where light emitted from an EL element 6003 is extracted from the first electrode 6004 side. In FIG. 10A, a first electrode 6004 of the EL element 6003 is electrically connected to a TFT 6001. The TFT 6001 is a p-channel type transistor; therefore; the first electrode 6004 is an anode.

The TFT 6001 can have a known structure including a crystalline semiconductor film or an amorphous semiconductor film, and includes a source electrode, a drain electrode, and a gate electrode. The TFT 6001 is covered with an interlayer insulating film 6007, over which a partition wall 6008 including an opening is formed. The first electrode 6004, which is connected to one of the source and drain electrodes in the opening of the partition wall 6008, is partly exposed, and the first electrode 6004, an electroluminescent layer 6005, and a second electrode 6006 are stacked in this order over the opening.

The interlayer insulating film 6007 may be formed using an organic material or an inorganic material, and have a single layer structure or a stacked-layer structure. As for an inorganic material, silicon oxide or silicon nitride may be employed. As for an organic material, polyimide, acrylic, siloxane; or polysilazane may be employed. Note that siloxane has a skeleton structure formed by a bond of silicon (Si) and oxygen (O). As a substituent, an organic group containing at least hydrogen (for example, an alkyl group and aromatic hydrocarbon) is used. A fluoro group may be employed as a substituent as well. Further, an organic group containing at least hydrogen and a fluoro group may be employed as a substituent. Polysilazane is formed of a polymer material having a bond of silicon (Si) and nitrogen (N) as a starting material. In addition, a material called a low dielectric constant material (low-k material) may be employed as the interlayer insulating film 6007.

The partition wall 6008 may be formed using an organic material or an inorganic material as well as the interlayer insulating film 6007. In the case where a photosensitive organic material is employed as the partition wall 6008, a side wall of an opening over the first electrode 6004 has an inclined surface with a continuous curvature. Such a shape can prevent the electroluminescent layer 6005 from breaking, and a short circuit between the first electrode 6004 and the second electrode 6006.

The first electrode 6004 is formed of a material suitable for an anode. A material suitable for an anode includes a metal, an alloy, an electrically conductive compound, and a composition thereof with a low work function. In order to extract light from the first electrode 6004 side, the first electrode 6004 is formed of a light transmissive material or to have a thickness enough to transmit light. Specifically, a light transmissive conductive material such as indium tin oxide (ITO), zinc oxide (ZnO), indium zinc oxide (IZO), or zinc oxide doped with gallium (GZO) may be employed. In addition, indium tin oxide containing silicon oxide (hereinafter referred to as ITSO), ITO mixed with zinc oxide (ZnO), and ITSO mixed with zinc oxide (ZnO) may be employed. As a non-light transmissive conductive material, for example, a single layer film selected from one or more of TiN, ZrN, Ti, W, Ni, Pt, Cr, Ag, Al, and the like may be employed as well as a stacked-layer structure of a film including aluminum as a main component and a titanium nitride film, a three-layer structure of a titanium nitride film, a film including aluminum as a main component, and a titanium nitride film, and the like. In the case of using a non-light transmissive conductive material, however, the first electrode 6004 is formed to have a enough thickness to emit light (preferably 5 nm to 30 nm, approximately).

The second electrode 6006 is formed of a material suitable for a cathode. A material suitable for a cathode includes a metal, an alloy, an electrically conductive compound, and a composition thereof with a low work function. In order to extract light only from the first electrode 6004 side, a material which reflects or shields light may be employed. Specifically, a metal such as Li, Cs, Mg, Ca and Sr, an alloy thereof (Mg:Ag, Al:Li, Mg:In, and the like), a compound thereof (calcium fluoride and calcium nitride), a rare earth metal such as Yb and Er, and the like may be employed.

The electroluminescent layer 6005 is formed of a single layer or a plurality of layers. In the case where the electroluminescent layer 6005 is formed of a plurality of layers, the plurality of layers are divided into a hole injecting layer, a hole transporting layer, a light emitting layer, an electron transporting layer, an electron injecting layer, and the like. Since the first electrode 6004 is an anode, a hole injecting layer, a hole transporting layer, a light emitting layer, an electron transporting layer and an electron injecting layer are stacked in this order. Note that a border between the layers is not required to be clear, and there may be the case where a part of a material forming each layer is mixed and a boundary thereof may be obscure. Each layer can be formed of an organic material or an inorganic material. As an organic material, a high molecular material, a medium molecular material, and a low molecular material may be employed. Note that a medium molecular material corresponds to a low polymer of which number of repetition of a structural unit (polymerization degree) is approximately 2 to 20. A distinction between a hole injecting layer and a hole transporting layer is not always distinct, which is the same as in the sense that a hole transporting property (hole mobility) is an especially important characteristic. A distinction can be made between the hole injecting layer, which is a layer on a side contacted with an anode, and the hole transporting layer, which is a layer contacted with the hole injecting layer. Similar description can be applied to an electron transporting layer and an electron injecting layer. A layer contacted with a cathode is called the electron injecting layer, while a layer contacted with the electron injecting layer is called the electron transporting layer. A light emitting layer may also serve as the electron transporting layer.

In the above-described pixel shown in FIG. 10A, light which is emitted from the EL element 6003 can be extracted from the first electrode 6004 side as shown by a hollow arrow.

Next, FIG. 10B shows a cross sectional view of a pixel circuit in the case where light emitted from an EL element 6013 is extracted from a second electrode 6016 side. In FIG. 10B, a first electrode 6014 of the EL element 6013 is electrically connected to a TFT 6011. The TFT 6011 is a p-channel type transistor; therefore, the first electrode 6014 is an anode. An electroluminescent layer 6015 and a second electrode 6016 are stacked over the first electrode 6014 in this order.

The first electrode 6014 is formed of a material suitable for an anode, and formed of a light reflecting or shielding material so as to extract light only from the second electrode 6016. For example, a single layer film selected from one or more of TiN, ZrN, Ti, W, Ni, Pt, Cr, Ag, Al, and the like may be employed for the first electrode 6014 as well as a stacked-layer structure of a titanium nitride film and a film including aluminum as a main component, a three-layer structure of a titanium nitride film, a film including aluminum as a main component, and a titanium nitride film, and the like.

The second electrode 6016 is formed of a material suitable for a cathode, and formed of a light transmissive material and to have a thickness enough to emit light so as to extract light from the second electrode 6016 side. Specifically, a metal such as Li, Cs, Mg, Ca and Sr, an alloy thereof (Mg:Ag, Al:Li, Mg:In, and the like), a compound thereof (calcium fluoride and calcium nitride), a rare earth metal such as Yb and Er, and the like may be employed, and a film is formed to have a thickness (preferably 5 to 30 nm, approximately) so as to emit light. Note that a light transmissive conductive material such as indium tin oxide (ITO), zinc oxide (ZnO), indium zinc oxide (IZO), or zinc oxide doped with gallium (GZO) may also be employed. In addition, indium tin oxide containing silicon oxide (hereinafter referred to as ITSO), ITO compounded with zinc oxide (ZnO), and ITSO compounded with zinc oxide (ZnO) may be employed. In the case of using such a light transmissive conductive film, an electron injecting layer is preferably formed in the electroluminescent layer 6015.

The electroluminescent layer 6015 may be formed in the same manner as the electroluminescent layer 6005 in FIG. 10A.

In the above-described pixel shown in FIG. 10B, light which is emitted from the EL element 6013 can be extracted from the second electrode 6016 side as shown by a hollow arrow.

Next, FIG. 10C shows a cross sectional configuration of a pixel circuit in the case where light emitted from an EL element 6023 is extracted from both a first electrode 6024 side and a second electrode 6026 side. In FIG. 10C, the first electrode 6024 of the EL element 6023 is electrically connected to a TFT 6021, and the TFT 6021 is a p-channel type transistor; therefore; the first electrode 6024 is an anode. An electroluminescent layer 6025 and the second electrode 6026 are stacked over the first electrode 6024 in this order.

The first electrode 6024 can be formed similarly to the first electrode 6004 in FIG. 10A to extract light from the first electrode 6024. The second electrode 6026 can be formed similarly to the second electrode 6016 in FIG. 10B to extract light from the second electrode 6026 as well. The electroluminescent layer 6025 can be formed similarly to the electroluminescent layer 6005 in FIG. 10A.

In the above-described pixel shown in FIG. 10C, light which is emitted from the EL element 6023 can be extracted from both the first electrode 6024 side and the second electrode 6026 side as shown by a hollow arrow.

In this embodiment mode, although description is made of the case where a first electrode is an anode and a second electrode is a cathode, a first electrode may be a cathode and a second electrode may be an anode. In the case where a first electrode is a cathode and a second electrode is an anode, an n-channel type thin film transistor is preferably employed as a driving transistor.

Note that this embodiment mode may be freely implemented in combination with other embodiment modes.

Embodiment Mode 7

An electronic apparatus including a display device of the invention includes a television apparatus (television or television receiver), a camera such as a digital camera, a digital video camera, a mobile phone (portable phone), a portable information terminal such as a PDA, a portable game machine, a monitor, a computer, an audio reproducing device such as a car audio, an image reproducing device provided with a recording medium such as a home-use game machine, and the like. Description is made of specific examples with reference to FIGS. 11A to 11F.

Figure 11A:
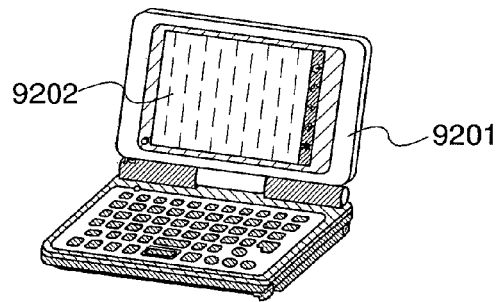
FIGS. 11A to 11F are diagrams each showing an electronic apparatus of the invention.

A portable information terminal using a display device of the invention shown in FIG. 11A includes a main body 9201, a display portion 9202, and the like. A portable information terminal with a large aperture ratio can be provided by the invention.

Figure 11B:
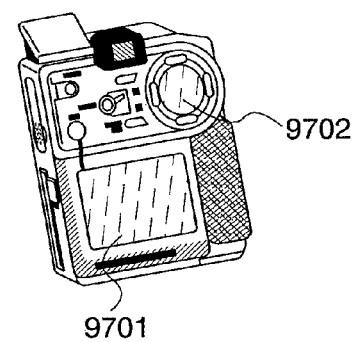

A digital video camera 9701 using a display device of the invention shown in FIG. 11B includes a display portion 9702 and the like. A digital video camera with a large aperture ratio can be provided by the invention.

Figure 11C:
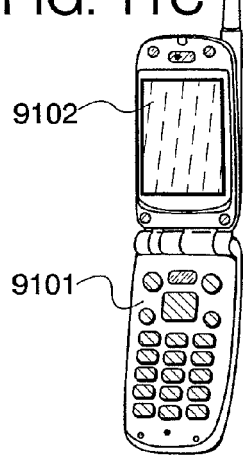

A portable phone using a display device of the invention shown in FIG. 11C includes a main body 9101, a display portion 9102, and the like. A portable phone with a large aperture ratio can be provided by the invention.

Figure 11D:
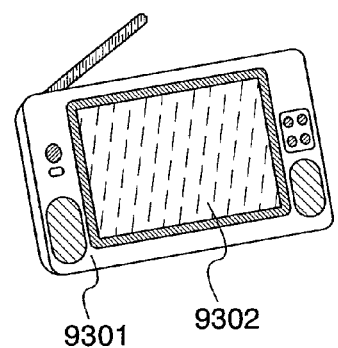

A portable television using a display device of the invention shown in FIG. 11D includes a main body 9301, a display portion 9302, and the like. A portable television with a large aperture ratio can be provided by the invention.

Figure 11E:
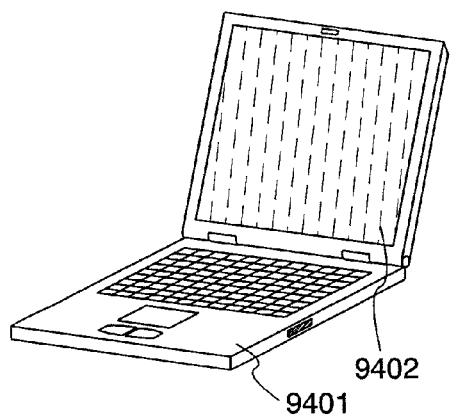

A portable computer using a display device of the invention shown in FIG. 11E includes a main body 9401, a display portion 9402, and the like. A portable computer with a large aperture ratio can be provided by the invention.

Figure 11F:
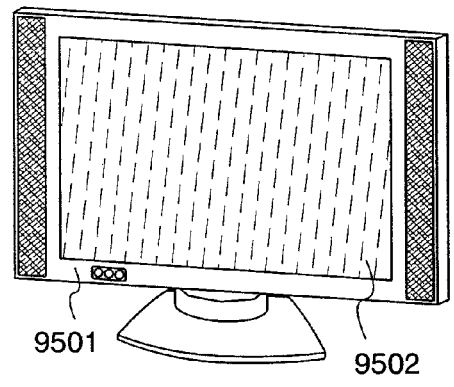

A television using a display device of the invention shown in FIG. 11F includes a main body 9501, a display portion 9502, and the like. A television with a large aperture ratio can be provided by the invention As described above, the display device of the invention can be applied to various electronic apparatuses.

This application is based on Japanese Patent Application serial No. 2005-269013 filed in Japan Patent Office on Sep. 15, 2005, the entire contents of which are hereby incorporated by reference.

What is claimed:

1. A semiconductor device comprising:
   first and second wires;
   a capacitor having a first electrode and a second electrode;
   a light emitting element having a first electrode and a second electrode;
   a transistor having a gate, a source, and a drain; and
   first to fourth switch elements, each having a first terminal and a second terminal,
   wherein the gate of the transistor is connected to the second electrode of the capacitor and the first terminal of the first switch element,
   wherein the source of the transistor is connected to the first wire,
   wherein the drain of the transistor is connected to the second terminal of the first switch element, the second terminal of the second switch element, and the first terminal of the third switch element,
   wherein the second switch element is provided between the transistor and a current source, and
   wherein the first electrode of the light emitting element is directly electrically connected to the second terminal of the third switch element and the second terminal of the fourth switch element.

2. The semiconductor device according to claim 1, wherein the light emitting element functions as a capacitor.

3. The semiconductor device according to claim 1, wherein the transistor is a p-channel transistor.

4. The semiconductor device according to claim 1, wherein the transistor is an n-channel transistor.

5. The semiconductor device according to claim 1, wherein the transistor is a driving transistor.

6. An electronic apparatus having the semiconductor device according to claim 1, the electronic apparatus is one selected from the group consisting of a television apparatus, a camera such as a digital camera, a digital video camera, a mobile phone, a portable information terminal such as a PDA, a portable game machine, a monitor, a computer, an audio reproducing device such as a car audio, and an image reproducing device provided with a recording medium such as a home-use game machine.

7. The semiconductor device according to claim 1, wherein the first wire is a power supply line.

8. The semiconductor device according to claim 1, wherein the second wire is a data line.

9. A semiconductor device comprising:
   first and second wires;
   a capacitor having a first electrode and a second electrode;
   a light emitting element having a first electrode and a second electrode; and
   first to fifth transistors, each having a gate, a first electrode, and a second electrode, wherein the gate of the first transistor is connected to the second electrode of the capacitor and the first electrode of the second transistor, wherein the first electrode of the first transistor is connected to the first wire, wherein the second electrode of the first transistor is connected to the second electrode of the second transistor and the first electrode of the fourth transistor, wherein the third transistor is provided between the first transistor and a current source, wherein the first electrode of the fifth transistor is connected to the first electrode of the second transistor and the second electrode of the capacitor, and wherein the first electrode of the light emitting element is directly electrically connected to the second electrode of the fourth transistor and the second electrode of the fifth transistor.

10. The semiconductor device according to claim 9, wherein the light emitting element functions as a capacitor.

11. The semiconductor device according to claim 9, wherein the first transistor is a p-channel transistor.

12. The semiconductor device according to claim 9, wherein the first transistor is an n-channel transistor.

13. The semiconductor device according to claim 9, wherein the first transistor is a driving transistor.

14. An electronic apparatus having the semiconductor device according to claim 9, the electronic apparatus is one selected from the group consisting of a television apparatus, a camera such as a digital camera, a digital video camera, a mobile phone, a portable information terminal such as a PDA, a portable game machine, a monitor, a computer, an audio reproducing device such as a car audio, and an image reproducing device provided with a recording medium such as a home-use game machine.

15. The semiconductor device according to claim 9, wherein the first wire is a power supply line.

16. The semiconductor device according to claim 9, wherein the second wire is a data line.

17. The semiconductor device according to claim 9, wherein the first to fifth transistors have the same polarity.

18. A driving method of a semiconductor device comprising:

storing a first charge in a light emitting element;

storing a second charge in a capacitor;

dividing the stored first charge and the stored second charge into the light emitting element and the capacitor by electrically connecting the light emitting element and the capacitor each other through a first switch element; and emitting light from the light emitting element by turning a transistor and a second switch element on, wherein a gate electrode of the transistor is electrically connected to the capacitor and the first switch element, wherein one of a source electrode and a drain electrode of the transistor is electrically connected to the capacitor, wherein the other of the source electrode and the drain electrode of the transistor is directly electrically connected to the second switch element, and wherein the second switch element is directly electrically connected to the light emitting element.

19. The driving method of a semiconductor device according to claim 18, wherein the light emitting element functions as a capacitor.

20. The driving method of a semiconductor device according to claim 18, wherein the transistor is a p-channel transistor.

21. The driving method of a semiconductor device according to claim 18, wherein the transistor is an n-channel transistor.

22. The driving method of a semiconductor device according to claim 18, wherein the transistor is a driving transistor.

* * * * *